(12) United States Patent
Bairo

(10) Patent No.: US 12,170,303 B2
(45) Date of Patent: Dec. 17, 2024

(54) SEMICONDUCTOR DEVICE AND ELECTRONIC EQUIPMENT

(71) Applicant: SONY SEMICONDUCTOR SOLUTIONS CORPORATION, Kanagawa (JP)

(72) Inventor: Masaaki Bairo, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 157 days.

(21) Appl. No.: 17/910,915

(22) PCT Filed: Feb. 17, 2021

(86) PCT No.: PCT/JP2021/005876
§ 371 (c)(1),
(2) Date: Sep. 12, 2022

(87) PCT Pub. No.: WO2021/199754
PCT Pub. Date: Oct. 7, 2021

(65) Prior Publication Data
US 2023/0207597 A1 Jun. 29, 2023

(30) Foreign Application Priority Data
Mar. 30, 2020 (JP) .................. 2020-060404

(51) Int. Cl.
*H01L 27/146* (2006.01)
*H04N 25/773* (2023.01)
*H01L 23/00* (2006.01)

(52) U.S. Cl.
CPC .. *H01L 27/14634* (2013.01); *H01L 27/14636* (2013.01); *H04N 25/773* (2023.01);
(Continued)

(58) Field of Classification Search
None
See application file for complete search history.

(56) References Cited

U.S. PATENT DOCUMENTS

2007/0181918 A1* 8/2007 Wada ................ H01L 29/94
257/288
2013/0175591 A1* 7/2013 Bairo ................ H01L 27/0629
257/296

(Continued)

FOREIGN PATENT DOCUMENTS

JP H04-241449 8/1992
JP 2005-183739 7/2005
(Continued)

OTHER PUBLICATIONS

English translation of WO-2019063892-A1, Pasternak, 2019 (Year: 2019).*

(Continued)

*Primary Examiner* — James M Hannett
(74) *Attorney, Agent, or Firm* — SHERIDAN ROSS P.C.

(57) ABSTRACT

A semiconductor device capable of realizing a capacitative element of which a capacitance value has low bias dependence and of which capacitance density is high without lowering operating voltage is provided. The semiconductor device includes: a semiconductor substrate; a first capacitative element stacked on the semiconductor substrate; and a second capacitative element which is stacked on an opposite side to a side of the semiconductor substrate of the first capacitative element and of which a capacitance value has bias characteristics being opposite to bias characteristics of a capacitance value of the first capacitative element, wherein the first capacitative element and the second capacitative element are connected in parallel.

20 Claims, 32 Drawing Sheets

(52) U.S. Cl.
CPC .............. *H01L 24/05* (2013.01); *H01L 24/08* (2013.01); *H01L 2224/05647* (2013.01); *H01L 2224/08145* (2013.01)

(56) References Cited

U.S. PATENT DOCUMENTS

2014/0231957 A1      8/2014  Zhu et al.
2017/0230598 A1*     8/2017  Takayanagi ....... H01L 27/14636

FOREIGN PATENT DOCUMENTS

| | | |
|---|---|---|
| JP | 2006-128468 | 5/2006 |
| JP | 2007-208101 | 8/2007 |
| JP | 2011-254088 | 12/2011 |
| JP | 2013-143446 | 7/2013 |
| JP | 2016-511941 | 4/2016 |
| JP | 2018-037626 | 3/2018 |
| JP | 2018-088648 | 6/2018 |
| JP | 2018-148528 | 9/2018 |
| WO | WO-2019063892 A1 * 4/2019 | ....... H01L 27/14634 |

OTHER PUBLICATIONS

International Search Report and Written Opinion prepared by the Japan Patent Office on Apr. 23, 2021, for International Application No. PCT/JP2021/005876, 3 pgs.

\* cited by examiner

Fig. 32

| | DEVICE | ELECTRODE CONNECTION DIRECTION | SIGN OF SLOPE OF BIAS DEPENDENCE OF CAPACITANCE VALUE |
|---|---|---|---|
| Chip1 | N+ ACCUMULATION MOS CAPACITANCE | FORWARD | POSITIVE |
| | | OPPOSITE | NEGATIVE |
| | P+ ACCUMULATION MOS CAPACITANCE | FORWARD | NEGATIVE |
| | | OPPOSITE | POSITIVE |
| | MIM CAPACITATIVE ELEMENT | FORWARD | POSITIVE |
| | | OPPOSITE | NEGATIVE |
| | MOM CAPACITATIVE ELEMENT | IGNORED | — |
| | PIP CAPACITATIVE ELEMENT | IGNORED | — |
| CONNECTING PORTION | CONNECTING PORTION CAPACITATIVE ELEMENT | IGNORED | — |
| Chip2 | N+ ACCUMULATION MOS CAPACITANCE | FORWARD | POSITIVE |
| | | OPPOSITE | NEGATIVE |
| | P+ ACCUMULATION MOS CAPACITANCE | FORWARD | NEGATIVE |
| | | OPPOSITE | POSITIVE |
| | MIM CAPACITATIVE ELEMENT | FORWARD | POSITIVE |
| | | OPPOSITE | NEGATIVE |
| | MOM CAPACITATIVE ELEMENT | IGNORED | — |
| | PIP CAPACITATIVE ELEMENT | IGNORED | — |

SEMICONDUCTOR DEVICE AND ELECTRONIC EQUIPMENT

CROSS REFERENCE TO RELATED APPLICATIONS

This application is a national stage application under 35 U.S.C. 371 and claims the benefit of PCT Application No. PCT/JP2021/005876, having an international filing date of 17 Feb. 2021, which designated the United States, which PCT application claimed the benefit of Japanese Patent Application No. 2020-060404, filed 30 Mar. 2020, the entire disclosures of each of which are incorporated herein by reference.

TECHNICAL FIELD

The technique according to the present disclosure (the present technique) relates to a semiconductor device and to electronic equipment including a semiconductor device.

BACKGROUND ART

While examples of a solid-state imaging device for capturing images include CCD (Charge Coupled Device) image sensors and CMOS (Complementary Metal Oxide Semiconductor) image sensors, CMOS image sensors that can be manufactured by known CMOS processes without the need for investment in special facilities are attracting attention and are becoming rapidly adopted in camera systems built into mobile phones and in surveillance systems.

Since a need for smaller sizes and higher performance in CMOS image sensors has arisen with advances in the application of CMOS image sensors to various fields, a stacked CMOS image sensor in which a sensor portion and a peripheral circuit portion are formed of different substrates (wafers) and the wafers are bonded to each other using a WoW technique to impart functionality as an image sensor has been proposed in order to satisfy such a need (PTL 1).

In the stacked CMOS image sensor described above, incident light is received by the sensor portion and the incident light is photoelectrically converted inside the sensor portion by a photodiode. An electric charge generated by the photodiode is subjected to analog-digital conversion into a pixel signal by the peripheral circuit portion. In this case, in the peripheral circuit portion, a coupling capacitor for interrupting a direct current component of an input signal is used.

Although the higher a capacitance density (a capacitance value per unit area) of a capacitative element used by the coupling capacitor, the smaller the coupling capacitor can be, the capacitance value must have a low bias dependence. This is because when the bias dependence of the capacitance value is high, for example, a pixel signal or a reference signal transmitted to a gate electrode of a differential input transistor of a comparator becomes distorted and accuracy of analog-digital conversion deteriorates significantly.

In addition, there is an ongoing transition of CMOS processes for manufacturing peripheral circuit portions to fine processes. However, even if a transition to a fine process is made, while a logic circuit which is constituted of a MOSFET such as an SRAM or a logic and which processes a digital signal can be downsized, an analog circuit which processes an analog signal output from the sensor portion cannot be readily downsized. This is because, while the larger a maximum electric charge amount readable by the sensor portion of an image sensor, the greater the performance of the image sensor, since a detected electric charge amount is converted into voltage and propagates through a circuit, even if a manufacturing process generation is miniaturized, an operating voltage of a device constituting an analog circuit that receives a signal from the sensor portion does not drop as long as a performance of the maximum electric charge amount is maintained and the device itself cannot be miniaturized in accordance with a scaling rule.

As a capacitative element to be formed on a semiconductor substrate, respective uses of a MOS capacitative element described in PTL 2, a comb-shaped wiring capacitative element described in PTL 3, and a MIM (Metal Insulator Metal) capacitative element described in PTL 4 are proposed.

Capacitance densities of a MOS capacitative element and a MIM capacitative element are pretty much determined by a film thickness (d) and a dielectric constant ($\varepsilon$) of a gate insulating film ($\varepsilon/d$). As a method of increasing capacitance density, while a method of reducing film thickness is generally used since a method of increasing the dielectric constant results in an increase in manufacturing cost, reducing the film thickness of an insulating film without lowering the operating voltage of the capacitative element causes TDDB (Time Dependent Dielectric Breakdown) representing a lifetime of the insulating film to deteriorate and shortens product life.

In addition, while a comb-shaped wiring capacitative element is an element which utilizes a parasitic capacitance formed by arranging wirings so as to oppose each other as a capacitative element, a wiring space must be reduced in order to increase capacitance density. However, reducing the wiring space without lowering an operating voltage of the capacitative element causes TDDB of the insulating film between wiring spaces to deteriorate and shortens product life. Furthermore, another reason why the capacitance value of the comb-shaped wiring capacitative element does not increase is the fact that when miniaturization of processes is advanced, a Low-K film with a lower dielectric constant is used as the insulating film covering a wiring layer.

In addition, although image sensors generally perform signal processing by converting an analog signal detected by a sensor portion into a digital signal with an AD converter, recently, more successive approximation AD converters are becoming adopted for the purpose of downsizing and accelerating an image sensor (PTL 5).

A successive approximation AD converter generally includes a capacitive DA converter as a component. A capacitive DA converter is constituted of a capacitance array in which, when a capacitance value of a single capacitative element is to be denoted by C, capacitative elements with capacitance values $C, 2C, 4C, \ldots, 2-N*C$ being the power of 2 of C are connected in parallel, and the capacitive DA converter converts a digital signal into an analog signal using the principle of electric charge redistribution.

In this case, unless a ratio of capacitance values between capacitative elements does not conform to a value being the power of 2, an error occurs when a DA (digital to analog) conversion is performed from a digital signal into an analog signal. Reasons why the ratio of capacitance values between capacitative elements deviates from an exponential value of 2 include an intrinsic bias dependence of the capacitance value of a capacitative element. In order to reduce the error of DA conversion, the bias dependence of the capacitance value must be reduced.

CITATION LIST

Patent Literature

[PTL 1]
  JP 2018-148528A
[PTL 2]
  JP 2011-254088A
[PTL 3]
  JP 2005-183739A
[PTL 4]
  JP 2018-37626A
[PTL 5]
  JP 2018-88648A

SUMMARY

Technical Problem

As described above, in order to downsize stacked image sensors, there is a high demand for a capacitative element of which a capacitance value has low bias dependence and which has high capacitance density.

The present disclosure has been made in light of such circumstances and an object thereof is to provide a semiconductor device and electronic equipment capable of realizing a capacitative element of which a capacitance value has low bias dependence and which has high capacitance density without lowering an operating voltage.

Solution to Problem

An aspect of the present disclosure is a semiconductor device, including: a semiconductor substrate; a first capacitative element stacked on the semiconductor substrate; and a second capacitative element which is stacked on an opposite side to a side of the semiconductor substrate of the first capacitative element and of which a capacitance value has bias characteristics being opposite to bias characteristics of a capacitance value of the first capacitative element, wherein the first capacitative element and the second capacitative element are connected in parallel.

Another aspect of the present disclosure is electronic equipment, including a semiconductor device including: a semiconductor substrate; a first capacitative element stacked on the semiconductor substrate; and a second capacitative element which is stacked on an opposite side to a side of the semiconductor substrate of the first capacitative element and of which a capacitance value has bias characteristics being opposite to bias characteristics of a capacitance value of the first capacitative element, wherein the first capacitative element and the second capacitative element are connected in parallel.

BRIEF DESCRIPTION OF DRAWINGS

FIG. 32 is a table describing capacitive elements respectively mountable to an upper semiconductor substrate (Chip 1) and a lower semiconductor substrate (Chip 2) using a general CMOS process in another application example of the second embodiment.

DESCRIPTION OF EMBODIMENTS

Embodiments of the present disclosure will be described below with reference to the drawings. In descriptions of the drawings referred to in the following description, the same or similar portions will be denoted by the same or similar reference signs and redundant descriptions will be omitted. However, it should be noted that the drawings are schematic in nature and the relationships between thicknesses and planar dimensions, ratios of thicknesses of respective devices or respective members differ from reality. Therefore, specific thicknesses and dimensions should be determined by considering the following descriptions. In addition, it goes without saying that the drawings also include portions having different dimensional relationships and ratios from each other.

In addition, it is to be understood that definitions of directions such as upward and downward in the following description are merely definitions provided for the sake of brevity and are not intended to limit technical ideas of the present disclosure. For example, it is obvious that when an object is observed after being rotated by 90 degrees, up-down is converted into and interpreted as left-right, and when an object is observed after being rotated by 180 degrees, up-down is interpreted as being inverted.

The advantageous effects described in the present specification are merely exemplary and are not restrictive, and other advantageous effects may be produced.

First Embodiment

<Overall Configuration of Solid-State Imaging Device>

Figure 1:
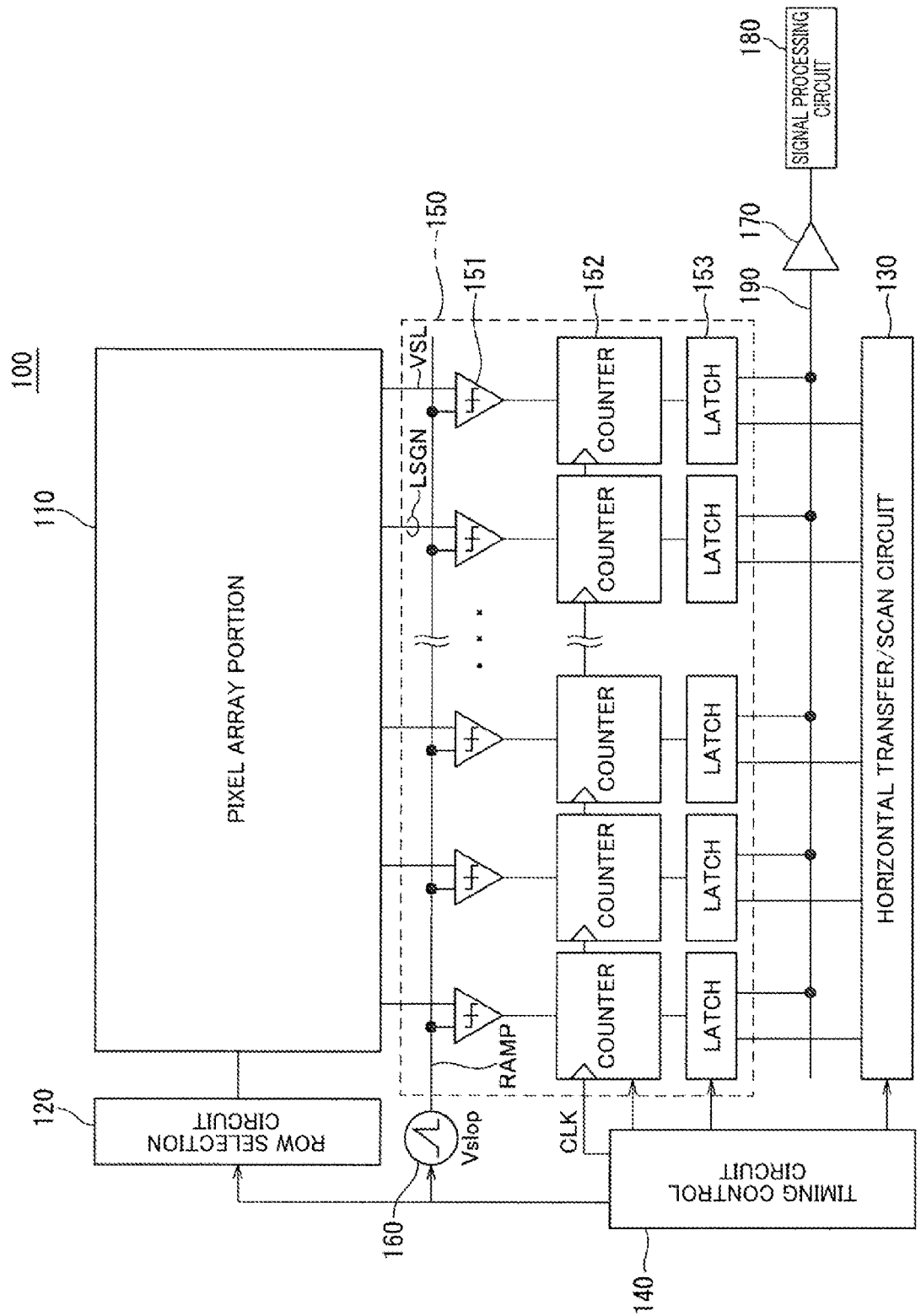
FIG. 1 is an equivalent circuit diagram of a solid-state imaging device according to a first embodiment.

As a first embodiment, a case where the semiconductor device according to the present technique is applied to a solid-state imaging device (a CMOS image sensor) will be exemplified. As shown in FIG. 1, a solid-state imaging device 100 according to the first embodiment includes a pixel array portion 110 and peripheral circuits which read an electric signal from the pixel array portion 110 and perform predetermined signal processing.

The solid-state imaging device 100 according to the first embodiment includes, as peripheral circuits, a row selection circuit 120 which controls row addresses and row scans, a horizontal transfer/scan circuit 130 which controls column addresses and column scans, and a timing control circuit 140 which generates an internal clock as a control circuit. In addition, the solid-state imaging device 100 according to the first embodiment includes, as peripheral circuits, an ADC group 150, a digital-analog converter (DAC) 160 as a ramp signal generator, an amplifier circuit 170, a signal processing circuit 180, and a horizontal transfer line 190. Furthermore, the solid-state imaging device 100 according to the first embodiment includes, as a peripheral circuit, a DC power supply circuit (not illustrated).

Figure 2:
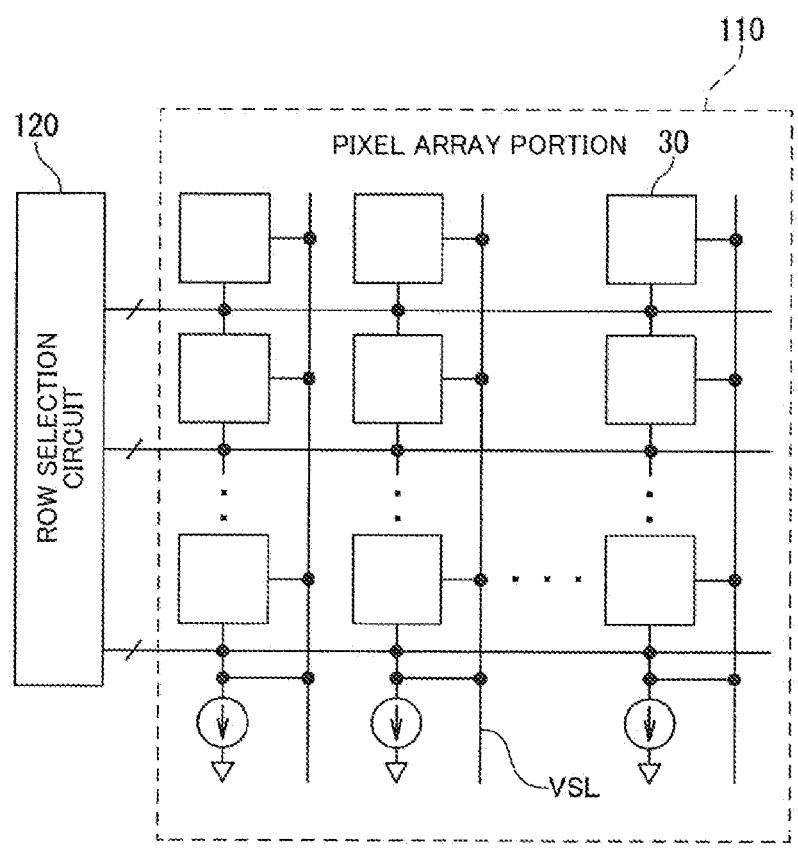
FIG. 2 is an equivalent circuit diagram of a pixel array portion according to the first embodiment.
Figure 3:
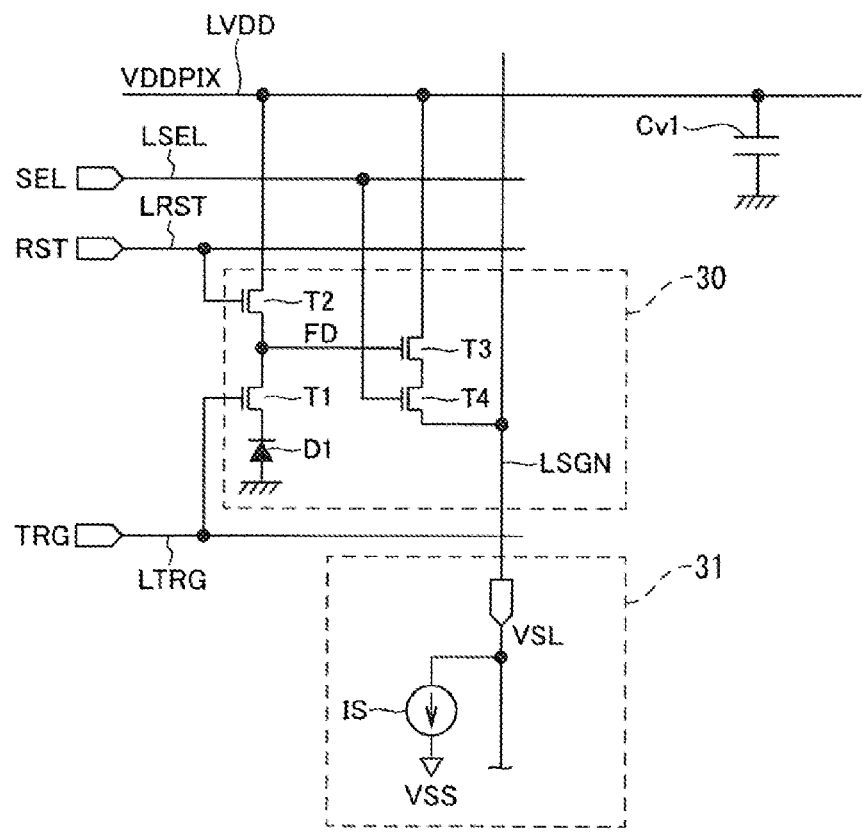
FIG. 3 is an equivalent circuit diagram of a pixel according to the first embodiment.

As shown in FIG. 2, the pixel array portion 110 is constituted of a large number of pixels 30 arranged in an array (a matrix pattern). For example, as shown in FIG. 3, the pixel 30 has a photoelectric conversion element D1 made of a photodiode (PD). With respect to the photoelectric conversion element D1, the pixel 30 has, as active elements, four transistors including a transfer transistor T1, a reset transistor T2, an amplifying transistor T3, and a selective transistor T4. In addition, in order to extract a signal from the pixel 30 as a voltage fluctuation, a constant-current source load 31 is connected to a vertical signal line (LSGN) being shared by pixels 30 in a column direction.

The photoelectric conversion element D1 photoelectrically converts incident light into an electric charge (in this case, electrons) in an amount corresponding to light intensity thereof. The transfer transistor T1 as a transfer element is connected between the photoelectric conversion element D1 and a floating diffusion (FD) as an input node, and a transfer signal TRG being a control signal is supplied to a gate (a transfer gate) of the transfer transistor T1 through a transfer control line LTRG. Accordingly, the transfer transistor T1 transfers electrons having been photoelectrically converted by the photoelectric conversion element D1 to the floating diffusion FD.

The reset transistor T2 is connected between a power supply line LVDD which is supplied with a power supply voltage VDD and the floating diffusion FD, and a reset signal RST being a control signal is supplied to a gate of the reset transistor T2 via a reset control line LRST. Accordingly, the reset transistor T2 as a reset element resets a potential of the floating diffusion FD to a potential of the power supply line LVDD.

A gate of the amplifying transistor T3 as an amplifying element is connected to the floating diffusion FD. In other words, the floating diffusion FD functions as an input node of the amplifying transistor T3 as an amplifying element. The amplifying transistor T3 and the selective transistor T4 are connected in series between the power supply line LVDD which is supplied with the power supply voltage VDD and the signal line LSGN. In this manner, the amplifying transistor T3 is connected to the signal line LSGN via the selective transistor T4 and constitutes a source follower with a constant-current source IS outside of the pixel portion. In addition, a selection signal SEL being a control signal in accordance with an address signal is supplied to a gate of the selective transistor T4 through a selection control line LSEL to turn on the selective transistor T4. When the selective transistor T4 is turned on, the amplifying transistor T3 amplifies the potential of the floating diffusion FD and outputs a voltage corresponding to the potential to the signal line LSGN. The voltage output from each pixel is output to the ADC group 150 through the signal line LSGN. For example, since respective gates of the transfer transistor T1, the reset transistor T2, and the selective transistor T4 are connected in units of rows, the operations described above are performed simultaneously with respect to each pixel of one row.

The reset control line LRST, the transfer control line LTRG, and the selection control line LSEL which are wired to the pixel array portion 110 are wired as a set in units of each row of the pixel arrangement. There are provided M-number of each of the reset control line LRST, the transfer control line LTRG, and the selection control line LSEL. The reset control lines LRST, the transfer control lines LTRG, and the selection control lines LSEL are driven by the row selection circuit 120.

A decoupling capacitor CV1 is connected between the power supply line LVDD and ground (GND). The decoupling capacitor CV1 removes a noise component mixed into a direct-current power supply voltage that is supplied in order to drive the circuits. In some cases, a total area of the decoupling capacitor CV1 exceeds 10 mm2 and occupies a large portion of a chip area of the stacked CMOS image sensor.

Figure 4:
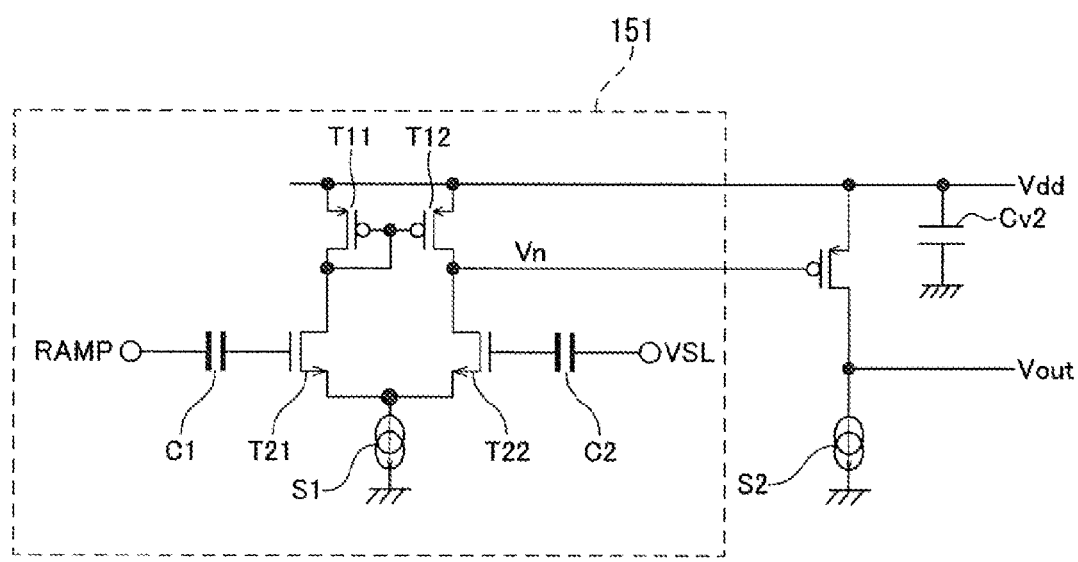
FIG. 4 is an equivalent circuit diagram of a comparator according to the first embodiment.

As the ADC group 150 shown in FIG. 1, a single slope ADC having a comparator 151, a counter 152, and a latch 153 is arranged in a plurality of columns. For example, as shown in FIG. 4, the comparator 151 has a differential amplification circuit including differential input transistors T21 and T22 which constitute a differential pair and active load transistors T11 and T12 made of current mirror circuits. The differential input transistors T21 and T22 are each constituted of an n-type MOSFET (hereinafter, also referred to as an "nMOS") and the active load transistors T11 and T12 are each constituted of a p-type MOSFET (hereinafter, also referred to as a "pMOS"). Among the peripheral circuits of the solid-state imaging device according to the first embodiment, the active load transistors T11 and T12 and the differential input transistors T21 and T22 act as noise sources.

Sampling capacitors C1 and C2 are connected in series to each of two differential input terminals of the comparator 151. The comparator 151 compares a reference voltage (a DAC-side input) Vslop being a ramp waveform obtained by varying, in a stepwise manner, a reference voltage generated by the DAC 160 and an analog signal (VSL (Vertical Signal Line)-side input) obtained via the vertical signal line LSGN from pixels per row line.

The counter 152 shown in FIG. 1 counts a comparison time of the comparator 151. The ADC group 150 has an n-bit digital signal conversion function and is arranged at each vertical signal line (a column line), and a column-parallel ADC block is configured. An output of each latch 153 is connected to, for example, a horizontal transfer line 190 with a 2n-bit width. In addition, 2n-number of amplifier circuits 170 corresponding to the horizontal transfer line 190 and the signal processing circuit 180 are arranged.

While the higher a capacitance density (a capacitance value per unit area) of a capacitative element used by the sampling capacitors C1 and C2 shown in FIG. 4, the smaller the sampling capacitors C1 and C2 can be, the capacitance value must have a low bias dependence. This is because when the bias dependence of the capacitance value is high, for example, a pixel signal or a reference signal transmitted to a gate electrode of a differential input transistor of a comparator becomes distorted and accuracy of analog-digital conversion deteriorates significantly. In addition, a decoupling capacitor CV2 is connected between the power supply line Vdd and ground (GND) to the comparator 151.

Therefore, in the first embodiment of the present disclosure, a capacitative element is realized of which a capacitance value has low bias dependence and of which capacitance density is high without reducing operating voltage even if the solid-state imaging device 100 is downsized.

Figure 5:
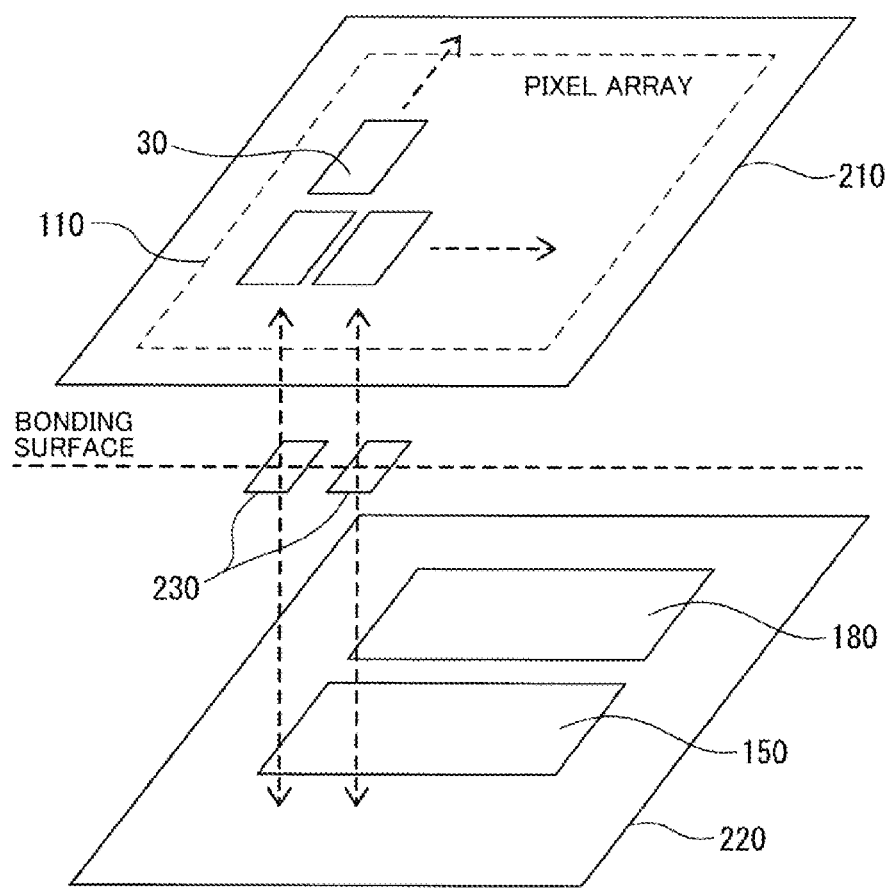
FIG. 5 is a schematic view of an upper semiconductor substrate and a lower semiconductor substrate according to the first embodiment.

FIG. 5 shows an arrangement plan of each circuit constituting the solid-state imaging device 100 according to the first embodiment on a semiconductor chip. The solid-state imaging device 100 according to the first embodiment is constituted of a stacked image sensor in which two semiconductor chips being an upper semiconductor substrate 210 and a lower semiconductor substrate 220 are stacked and parts of wirings of the upper and lower chips are electrically connected by a metal bonding portion 230 being a TSV (Through-silicon via) or the like. In this case, the pixel array portion 110 in which the pixels 30 are arranged in a matrix pattern is mounted to the upper semiconductor substrate 210 and peripheral circuits other than the pixel array portion 110 such as the ADC group 150 and the signal processing circuit 180 are mounted to the lower semiconductor substrate 220.

Figure 6:
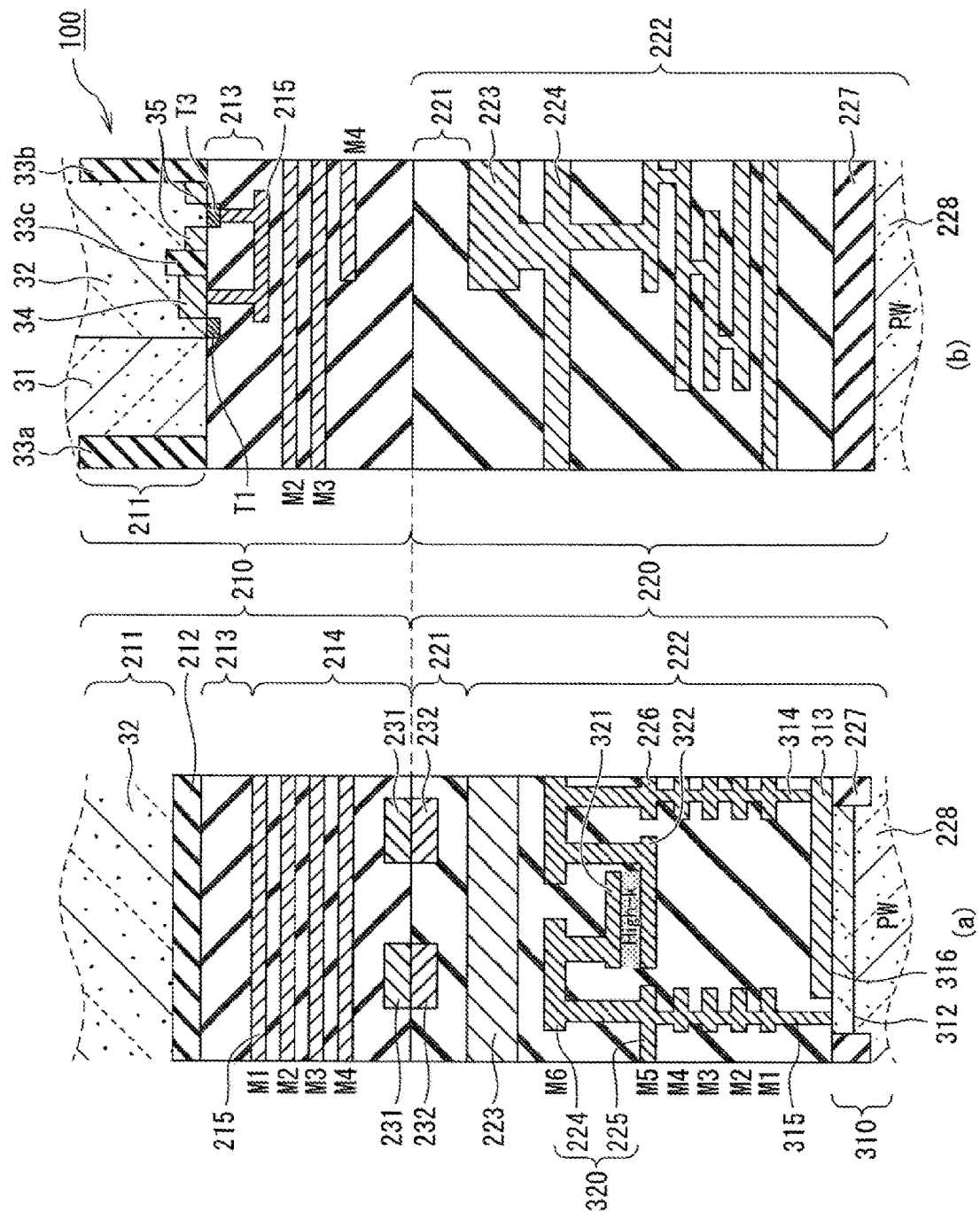
FIG. 6 is a sectional view in a solid-state imaging device according to the first embodiment.

FIG. 6 is a sectional view in the solid-state imaging device 100 according to the first embodiment. FIG. 6(a) shows the outside of a pixel and FIG. 6(b) shows the inside of the pixel.

In FIG. 6, the upper semiconductor substrate 210 is constituted of, from top to bottom, a photoelectric conversion layer 211, a *glabella* insulating film 213, and a wiring layer 214. The photoelectric conversion layer 211 is a layer on which the photodiode (PD) 31 is formed and which generates an electric charge in accordance with a light intensity of incident light due to photoelectric conversion. The PD 31 is electrically separated by element separation portions 33a and 33b formed inside the photoelectric conversion layer 211 for each pixel 30. In addition, a p-type well 32 is formed in a region where the PD 31 is not formed inside the photoelectric conversion layer 211. An FD 34 and an n-type diffusion layer 35 are formed in the p-type well 32. Note that only the p-type well 32 is formed outside of the pixel 30 as shown in FIG. 6(a).

The electric charge generated by the PD 31 is transferred to the FD 34 via the transfer transistor T1 provided in the *glabella* insulating film 213. The amplifying transistor T3 provided in the *glabella* insulating film 213 is positioned near the n-type diffusion layer 35. Element separation portions 33b and 33c are formed at both ends of the n-type diffusion layer 35. Accordingly, the FD 34 and the pixel transistor T3 are electrically separated from each other by the n-type diffusion layer 35 and the element separation portions 33b and 33c.

The wiring layer 214 is configured to include wirings (M1 to M4) 215 being stacked in a plurality of layers. The transfer transistor T1, the reset transistor T2, the amplifying transistor T3, and the selective transistor T4 which constitute each pixel 30 are driven via the plurality of layers of wirings (M1 to M4) 215 formed in the wiring layer 214. In addition, a metal bonding portion 231 made of copper (Cu) is provided inside the wiring layer 214 to perform bonding with the lower semiconductor substrate 220.

On the other hand, the lower semiconductor substrate 220 is constituted of, from top to bottom, a *glabella* insulating film 221 and a wiring layer 222. The wiring layer 222 is configured to include all wirings 223 and wirings (M1 to M6) 224 stacked in a plurality of layers. In addition, the *glabella* insulating film 221 is provided with a metal bonding portion 232 made of copper (Cu) to be bonded to the metal bonding portion 231 of the upper semiconductor substrate 210.

In the solid-state imaging device 100 configured as described above, an electric charge is generated as light incident to the upper semiconductor substrate 210 is photoelectrically converted by the PD 31. In addition, the generated electric charge is output to, via the amplifying transistor T3, the ADC group 150 formed on the lower semiconductor substrate 220 as a pixel signal by the signal line LSGN shown in FIG. 1 formed by the wirings (M1 to M4) 215 and wirings (M1 to M6) 224 of the lower semiconductor substrate 220.

Figure 7:
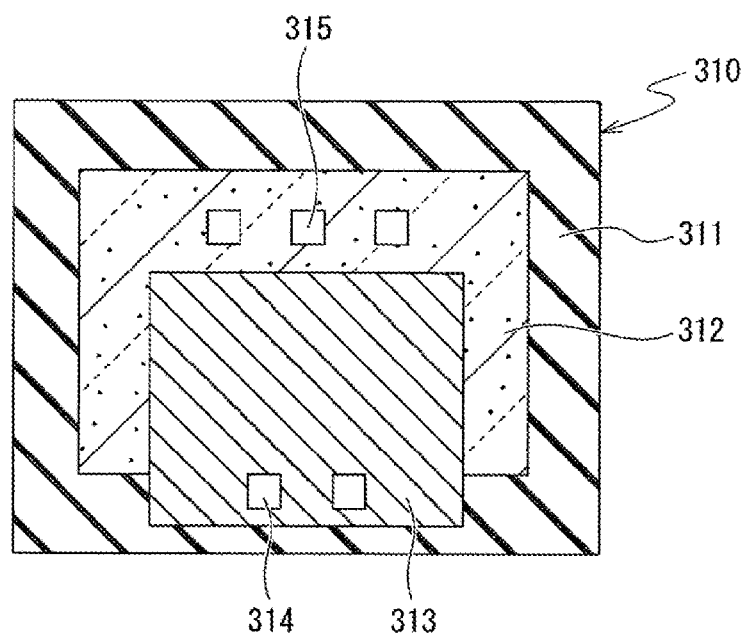
FIG. 7 is a plan view showing a configuration of an N+ accumulation MOS capacitative element according to the first embodiment.

As shown in FIG. 6(*a*), an N+ accumulation MOS capacitative element 310 is arranged on the lower semiconductor substrate 220. As shown in FIG. 7, when an electrode of the MOS capacitative element 310 closer to a side of the lower semiconductor substrate 220 on which the MOS capacitative element 310 is mounted is assumed to be a lower electrode 312, for example, the lower electrode 312 mounted on an element separation portion 311 is an n-type diffusion layer formed in a p-type well 228, a gate insulating film 316 made of silicon oxide (SiO$_2$) is present on the lower electrode 312, and an upper electrode 313 made of n-type polycrystalline silicon is formed on the gate insulating film 316. Since electrons are accumulated on a surface of the lower electrode 312 during operation of the MOS capacitative element 310, the MOS capacitative element 310 is referred to as an N+ accumulation MOS capacitance.

Figure 9:
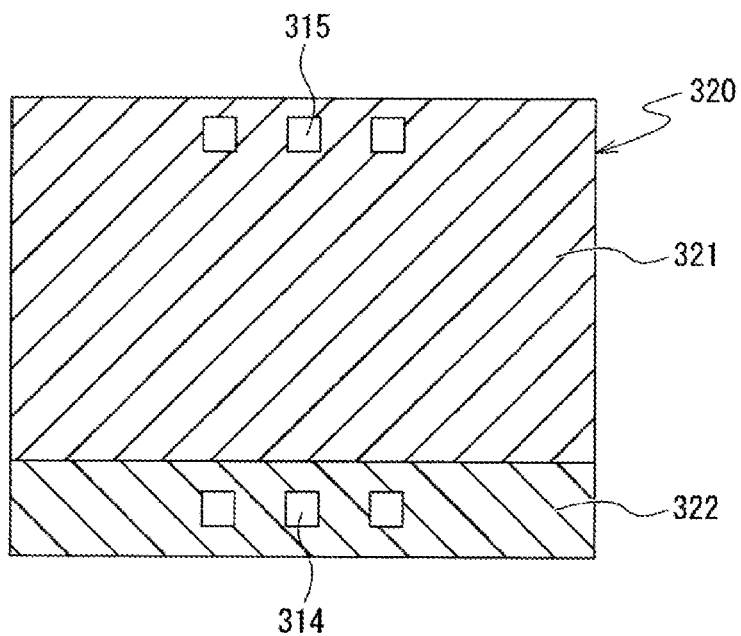
FIG. 9 is plan view showing a configuration of a MIM capacitative element according to the first embodiment.

A MIM (Metal Insulator Metal) capacitative element 320 formed by stacking a lower electrode 322 positioned near a side closer to the lower semiconductor substrate 220, an insulating film (including a High-K material), and an upper electrode 321 is mounted to a region forming the wirings (M1 to M6) 224 being an upper layer in a same region where the MOS capacitative element 310 is arranged. The insulating film is a monolayer film or a plurality of stacked films of any of Ta2O2, Nb2O3, Zr02, HfO2, La2O3, Pr2O3, AL2O3, SiO2, and SiN. As shown in FIG. 9, the lower electrode 322 and the upper electrode 321 are a monolayer film or a plurality of stacked films of any of Cu, Al, Ti, TiN, Ta, and TaN.

The wiring (M5) 224 is provided with a negative (Minus) terminal 225 and a positive (Plus) terminal 226.

Figure 8:
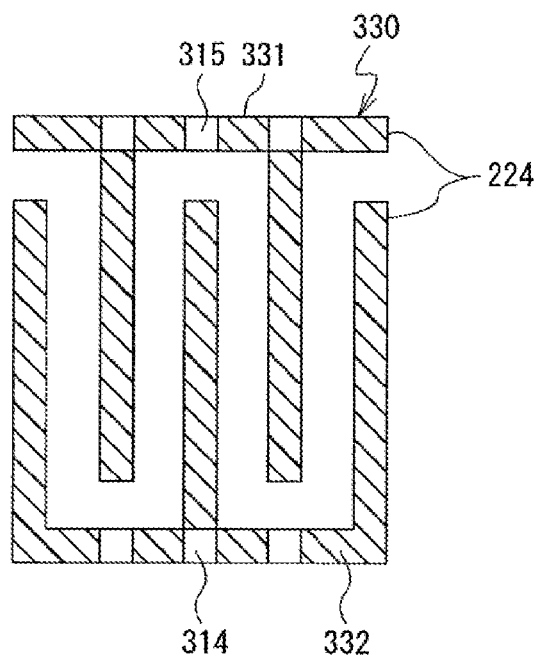
FIG. 8 is a plan view showing a configuration of a MOM capacitative element according to the first embodiment.
Figure 10:
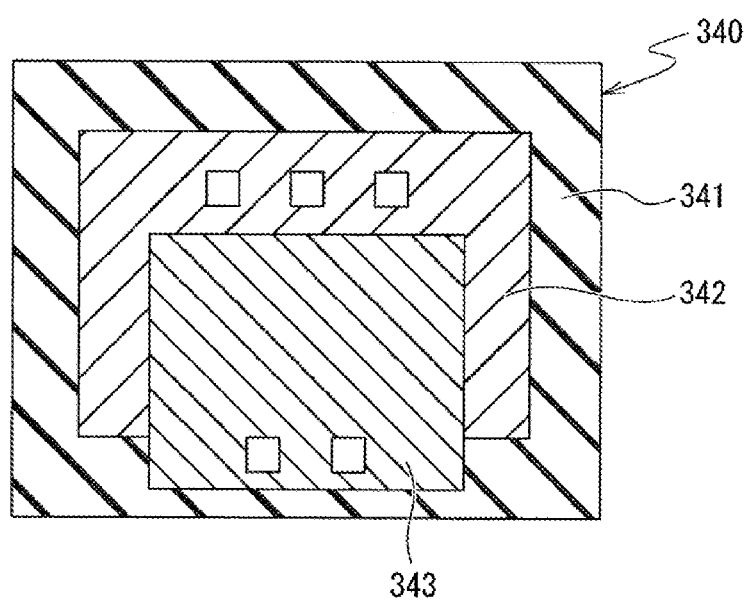
FIG. 10 is a plan view showing a configuration of a PIP capacitative element according to the first embodiment.

Note that, besides the MIM capacitative element 320, a comb-shaped wiring (MOM) capacitative element 330 shown in FIG. 8 or a PIP (Poly Insulator Poly) capacitative element 340 shown in FIG. 10 may be used.

Figure 11:
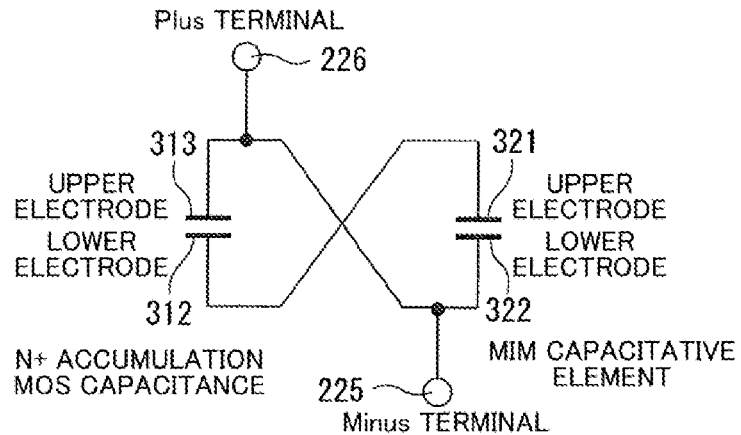
FIG. 11 is an equivalent circuit diagram showing a connection structure between an N+ accumulation MOS capacitative element and a MIM capacitative element according to the first embodiment.

As shown in FIG. 11, two capacitative elements are connected in parallel by connecting the lower electrode 312 of the N+ accumulation MOS capacitative element 310 and the upper electrode 321 of the MIM capacitative element 320 with a via 315 and the wiring (M6) 224 and connecting the upper electrode 313 of the MOS capacitative element 310 and the lower electrode 322 of the MIM capacitative element 320 with a via 314 and the wiring (M5) 224. Adopting a capacitative element that is structured in this manner has the following advantages.

A first advantage is an increase in capacitance density per unit area of the capacitative element. For example, if a capacitance value when a potential difference between electrodes of the MOS capacitative element 310 is 3 V had been 100 fF and a capacitance value when a potential difference between electrodes of the MIM capacitative element 320 is 3 V had been 100 fF, a capacitance value when the two capacitative elements (the MOS capacitative element 310 and the MIM capacitative element 320) are connected in parallel and operated at 3 V is 200 fF, which represents a twofold increase in capacitance density. Accordingly, compared to a case where capacitance density is increased by reducing a film thickness of the insulating films between electrodes of the MOS capacitative element 310 and the MIM capacitative element 320, capacitance density can be increased without shortening the life of TDDB.

Figure 12:
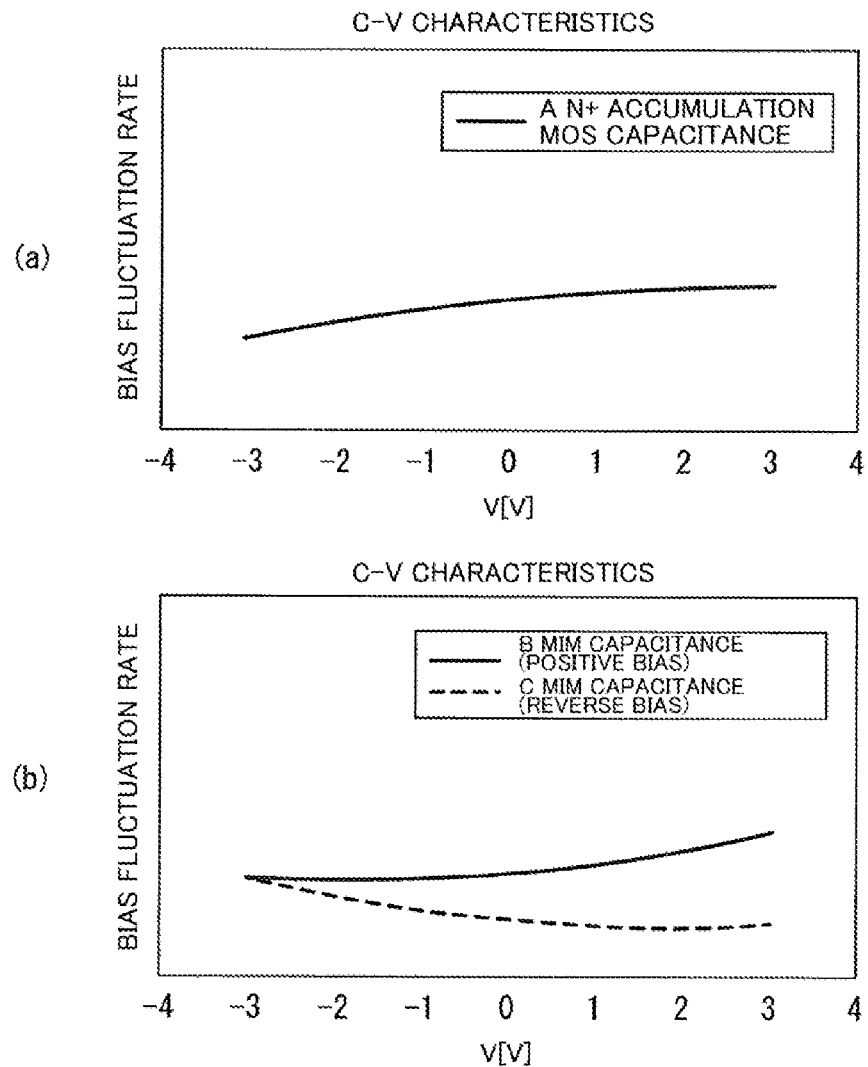
FIG. 12 is a diagram for explaining respective C-V characteristics of an N+ accumulation MOS capacitative element and a MIM capacitative element according to the first embodiment.

A second advantage is that bias dependence of a capacitance value can be reduced. This is due to the following mechanism. FIG. 12(*a*) shows C-V characteristics of the N+ accumulation MOS capacitative element 310. An abscissa represents a potential difference between electrodes and an ordinate represents a numerical value normalized by a capacitance value when the potential difference is −3 V. When the lower electrode 312 is fixed at 0 V and the potential of the upper electrode 313 is varied between −3 V and 3 V, the bias dependence of the capacitance value has a positive slope as depicted by a solid line A. On the other hand, regarding C-V characteristics of the MIM capacitative element 320, while a slope is positive as shown in FIG. 12(*b*) when the lower electrode 322 is fixed at 0 V and the potential of the upper electrode 321 is varied between −3 V and 3 V, a slope becomes negative as depicted by a dotted line C when the upper electrode 321 is fixed at 0 V and the potential of the lower electrode is varied between −3 V and 3 V.

Figure 13:
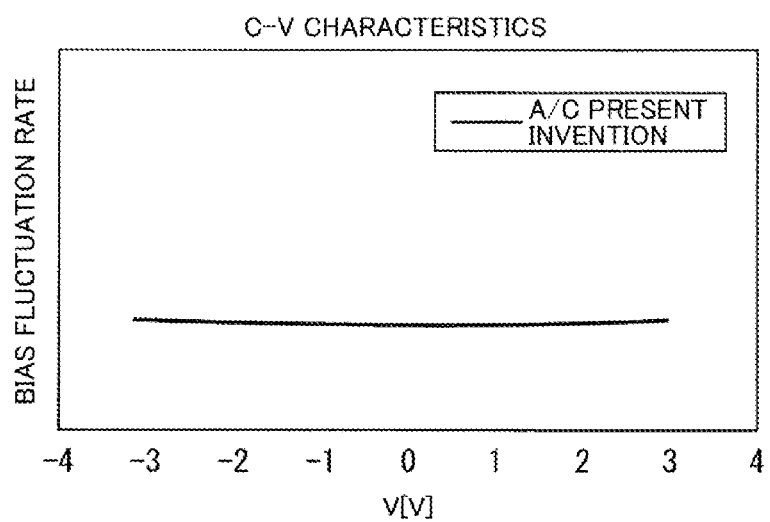
FIG. 13 is a diagram for explaining C-V characteristics when an N+ accumulation MOS capacitative element and a MIM capacitative element according to the first embodiment are connected in parallel.

In other words, when the negative terminal 225 is set to 0 V and the positive terminal 226 is varied between −3 V and 3 V in a state of parallel connection shown in FIG. 11, since bias dependence of the capacitance value of the N+ accumulation MOS capacitative element 310 and the bias dependence of the capacitance value of the MIM capacitative element 320 cancel each other out, C-V characteristics thereof exhibit A/C shown in FIG. 13 and a capacitative element of which a capacitance value has low voltage dependence can be formed.

As described above, a connection of each MOS capacitative element 310 and each MIM capacitative element 320 to be connected in parallel can be changed and a sign of a slope of bias dependence of a capacitance value thereof can be changed, and by connecting MOS capacitative elements 310 and MIM capacitative elements 320 with different slopes in parallel, the bias dependence of a capacitance value of the capacitative elements as a whole can be reduced.

Just how much the bias dependence: Ctotal(V)/Ctotal(0) of the capacitance value of the elements as a whole can be reduced depends on a capacitance density, an element size, and a bias dependence coefficient of each capacitative element to be connected in parallel, and an expectation thereof follows an equation presented below. Therefore, a designer can obtain desired characteristics by optimizing an element size of each capacitative element.

$$Ctotal(V)/Ctotal(0) = \Sigma An * Cn(V) * Sn/Cn(0) * Sn$$

Ctotal(V)/Ctotal(0) Bias dependence of capacitance value of elements as a whole (a standard value based on potential difference=0 V)

Ctotal(V) Capacitance value of elements as a whole when potential difference between electrodes is operating voltage V Ctotal(0) Capacitance value of elements as a whole when potential difference between electrodes is 0 V Cn(V) Capacitance density of each capacitative element when potential difference between electrodes is operating voltage V Sn Element size of each capacitative element An Bias dependence coefficient of capacitance value of each capacitative element (includes positive or negative)

In addition, while FIG. 6 shows an example in which two different capacitative elements, the MOS capacitative element 310 and the MIM capacitative element 320, are arranged in a same region, the capacitative elements need not necessarily be arranged in a same area.

Operational Advantages Due to First Embodiment

As described above, according to the first embodiment, by connecting in parallel to the N+ accumulation MOS capacitative element 310, the MIM capacitative element 320 having inverse characteristics to the C-V characteristics of the MOS capacitative element 310, bias characteristics are canceled out and a capacitative element with flat bias characteristics is realized. In addition, compared to a case where capacitance density is increased by reducing a film thickness of the insulating film between electrodes of the capacitative elements, capacitance density can be increased without shortening the life of TDDB. Therefore, a capacitative element of which a capacitance value has low bias dependence and which has high capacitance density without lowering an operating voltage can be realized. Furthermore, according to the first embodiment, a device structure and a size of each capacitative element and a connection method between the respective capacitative elements can be optimized so that C-V characteristics of the capacitative elements as a whole most closely approach 1.

<First Modification>

Figure 14:
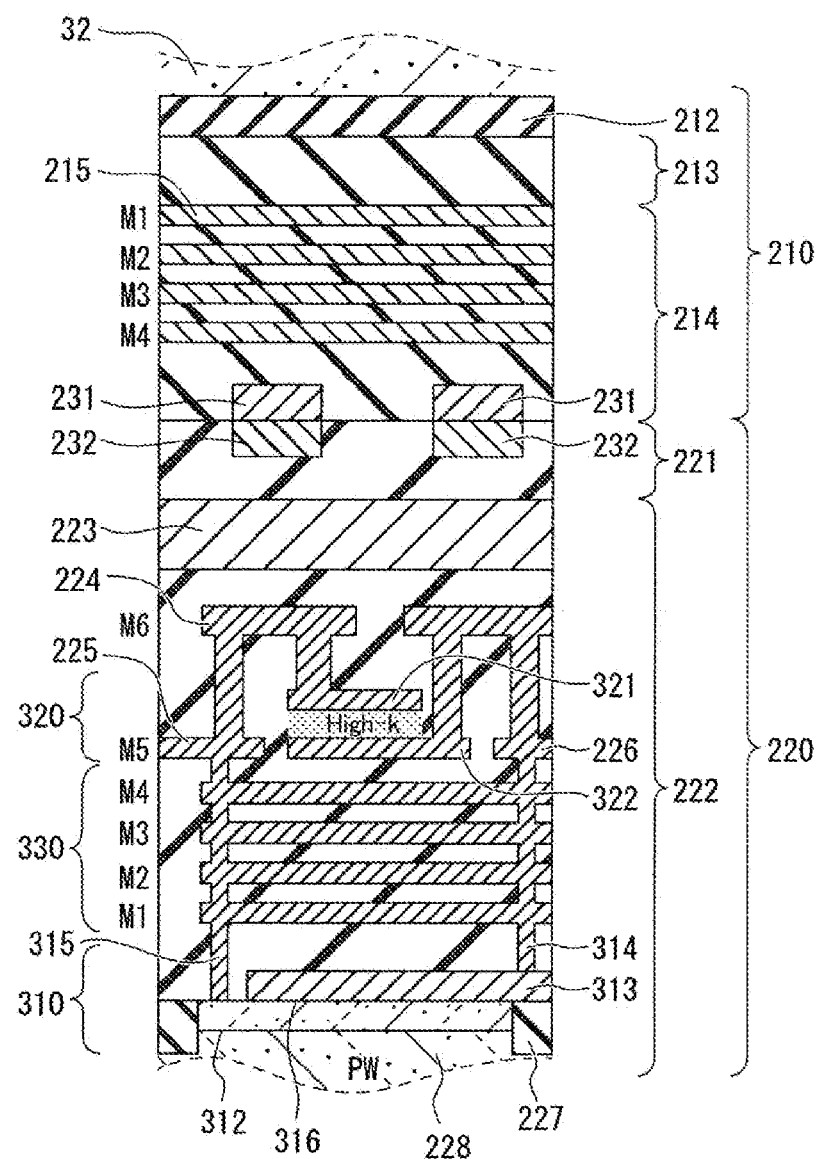
FIG. 14 is a sectional view in a solid-state imaging device according to a first modification of the first embodiment.

FIG. 14 is a sectional view in the solid-state imaging device 100 according to a first modification of the first embodiment. In FIG. 14, same parts as those in FIG. 6(a) described above are designated by same reference signs and detailed descriptions thereof will be omitted.

Figure 15:
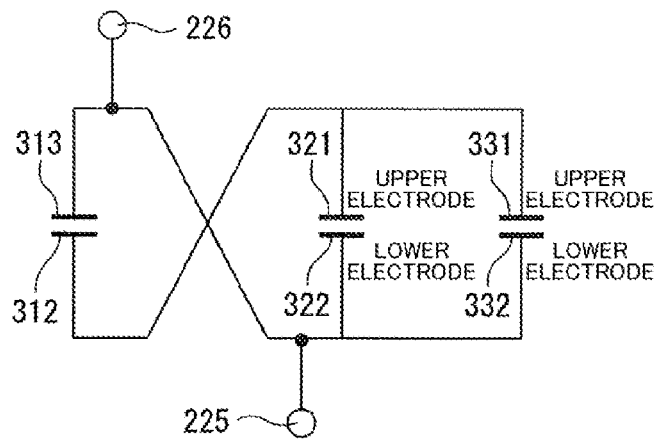
FIG. 15 is an equivalent circuit diagram in which an N+ accumulation MOS capacitative element, a MIM capacitative element, and a MOM capacitative element according to the first modification of the first embodiment are connected in parallel.

In FIG. 14, the solid-state imaging device 100 has a structure in which a MOM capacitative element 330 shown in FIG. 8 is formed using the wirings (M1 to M4) 224 on the lower semiconductor substrate 220 and the MOM capacitative elements 330 are connected in parallel to the N+ accumulation MOS capacitative element 310 and the MIM capacitative element 320. In this case, as shown in FIG. 15, an upper electrode 331 of the MOM capacitative element 330 is connected via the via 315 and the wiring (M6) 224 to the lower electrode 312 of the MOS capacitative element 310 and the upper electrode 321 of the MIM capacitative element 320. In addition, a lower electrode 332 of the MOM capacitative element 330 is connected via the via 314 and the wiring (M6) 224 to the upper electrode 313 of the MOS capacitative element 310 and the lower electrode 322 of the MIM capacitative element 320. Adopting such a structure enables capacitance density to be further increased.

Figure 16:
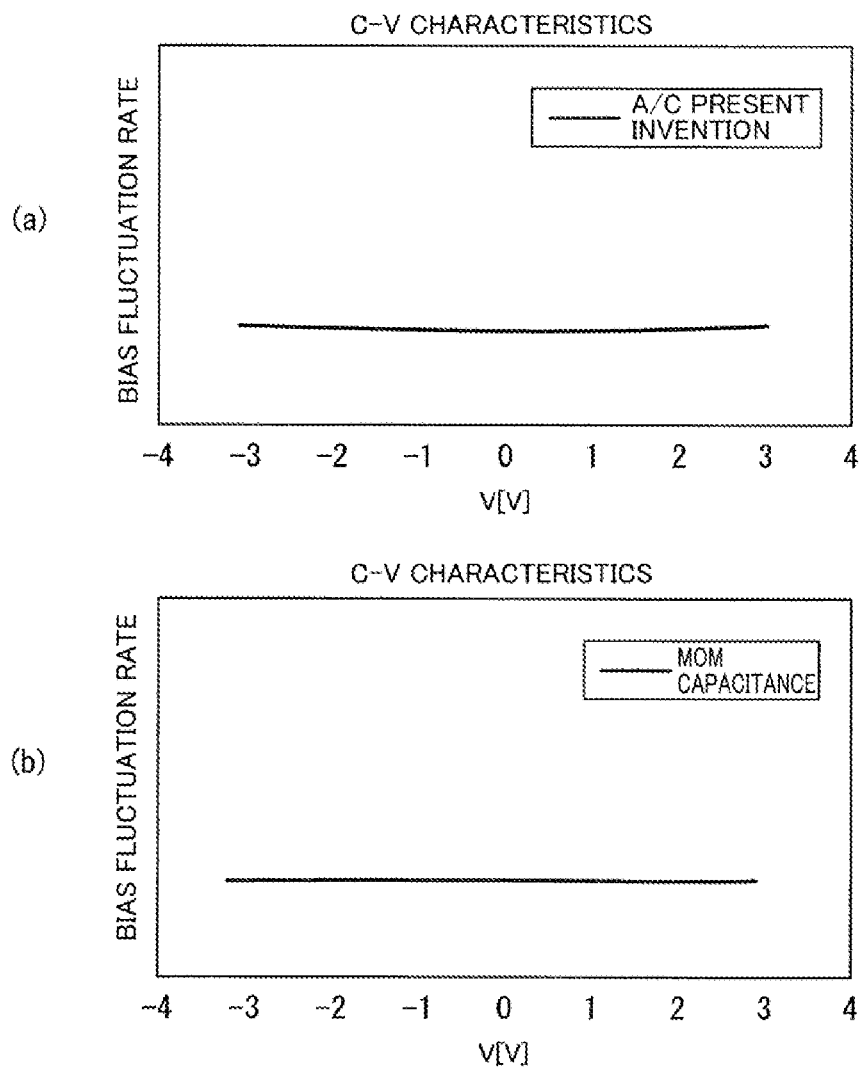
FIG. 16 is a diagram for explaining C-V characteristics of a MOM capacitative element according to the first modification of the first embodiment by way of comparison with the C-V characteristics shown in FIG. 13 described above.

As shown in FIG. 16(b), in C-V characteristics of the general MOM capacitative element 330, bias dependence of a capacitance value is extremely low regardless of whether a bias applied between electrodes is positive or negative. In this state, the C-V characteristics are similar to those when connecting, in parallel, the N+ accumulation MOS capacitative element 310 and the MIM capacitative element 320 shown in FIG. 16(a) described above. Therefore, even when such a MOM capacitative element 330 is added to the capacitative elements to be connected in parallel, the bias dependence of the capacitance value of the capacitative elements as a whole does not increase significantly. In addition, since the bias dependence of the capacitance value described above does not differ significantly between applying a positive bias and applying a negative bias between electrodes, there is no need to be conscious of a connection method of the electrodes and any of the electrodes may be connected to the positive (Plus) terminal 226.

<Second Modification>

Figure 17:
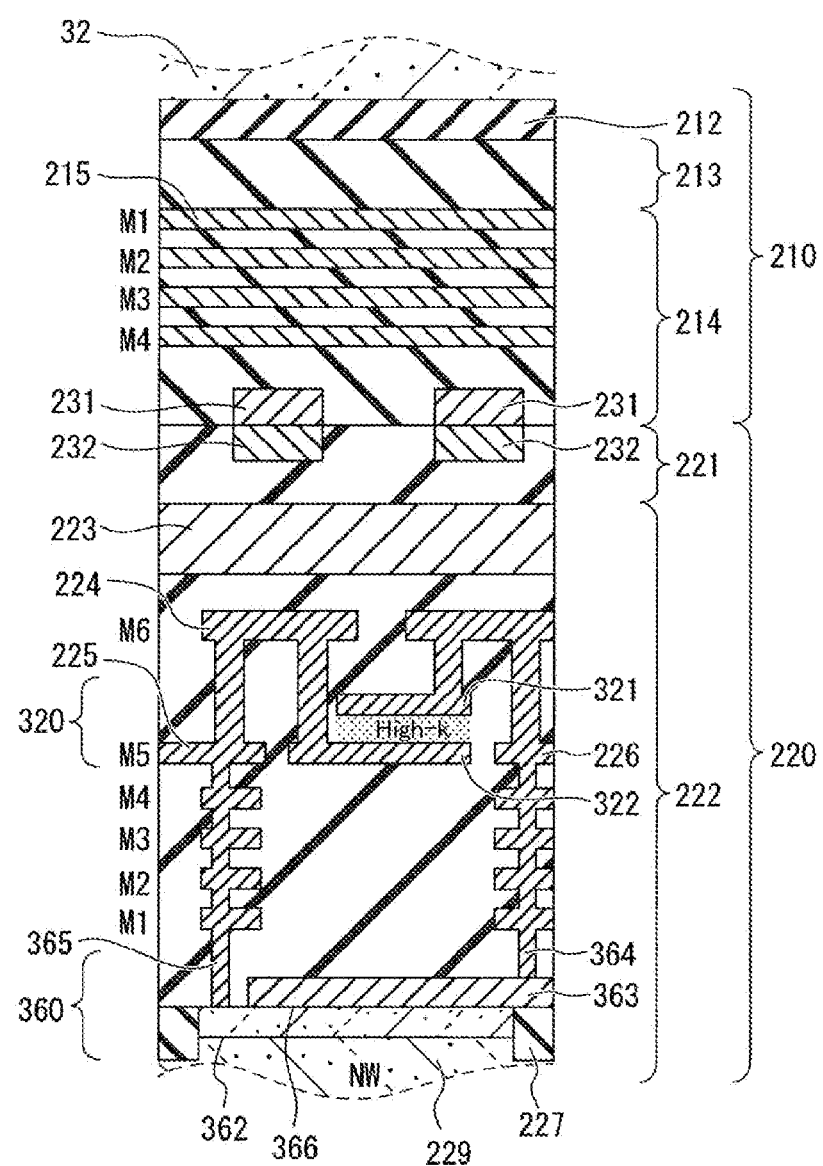
FIG. 17 is a sectional view in a solid-state imaging device according to a second modification of the first embodiment.

FIG. 17 is a sectional view in the solid-state imaging device 100 according to a second modification of the first embodiment. In FIG. 17, same parts as those in FIG. 6(a) described above are designated by same reference signs and detailed descriptions thereof will be omitted.

In FIG. 17, the solid-state imaging device 100 utilizes a hole accumulation MOS capacitative element 360 (referred to as a P+ accumulation MOS capacitance). In the MOS capacitative element 360, a lower electrode 362 that is close to a side of the lower semiconductor substrate 220 is a p-type diffusion layer formed in an n-type well 229, a gate insulating film 366 made of silicon oxide (SiO2) is present on the lower electrode 362, and an upper electrode 363 made of p-type polycrystalline silicon is formed on the gate insulating film 366.

Figure 18:
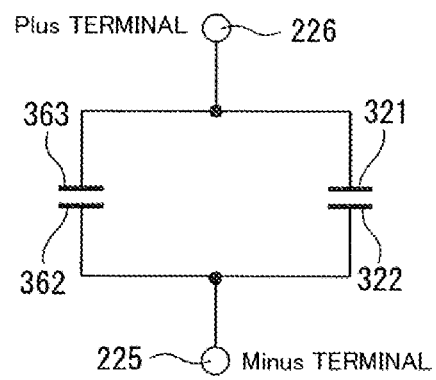
FIG. 18 is an equivalent circuit diagram in which a P+ accumulation MOS capacitative element and a MIM capacitative element according to the second modification of the first embodiment are connected in parallel.

As shown in FIG. 18, the upper electrode 363 of the MOS capacitative element 360 is connected via a via 364 and the wiring (M6) 224 to the upper electrode 321 of the MIM capacitative element 320. In addition, the lower electrode 362 of the MOS capacitative element 360 is connected via a via 365 and the wiring (M6) 224 to the lower electrode 322 of the MIM capacitative element 320.

Figure 19:
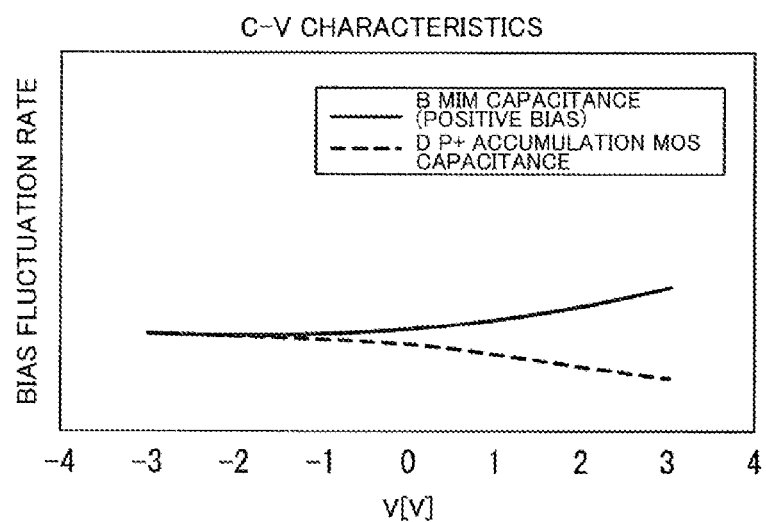
FIG. 19 is a diagram for explaining respective C-V characteristics of a P+ accumulation MOS capacitative element and a MIM capacitative element according to the second modification of the first embodiment.

In the MOS capacitative element 360, holes are accumulated on a surface of the lower electrode 362 during operation. Regarding C-V characteristics thereof, as shown in FIG. 19, a sign of bias dependence of a capacitance value when the lower electrode 362 is fixed at 0 V and the potential of the upper electrode 363 is varied between −3 V and 3 V is negative (a dotted line D). On the other hand, when the lower electrode 322 of the MIM capacitative element 320 is fixed at 0 V and the potential of the upper electrode 321 is varied between −3 V and 3 V, the sign of the bias dependence of the capacitance value is positive (a solid line B). Therefore, by connecting, in parallel, upper electrodes and lower electrodes of the two capacitative elements 320 and 360 to each other, the bias dependence of the capacitance value can be reduced.

<Third Modification>

Figure 20:
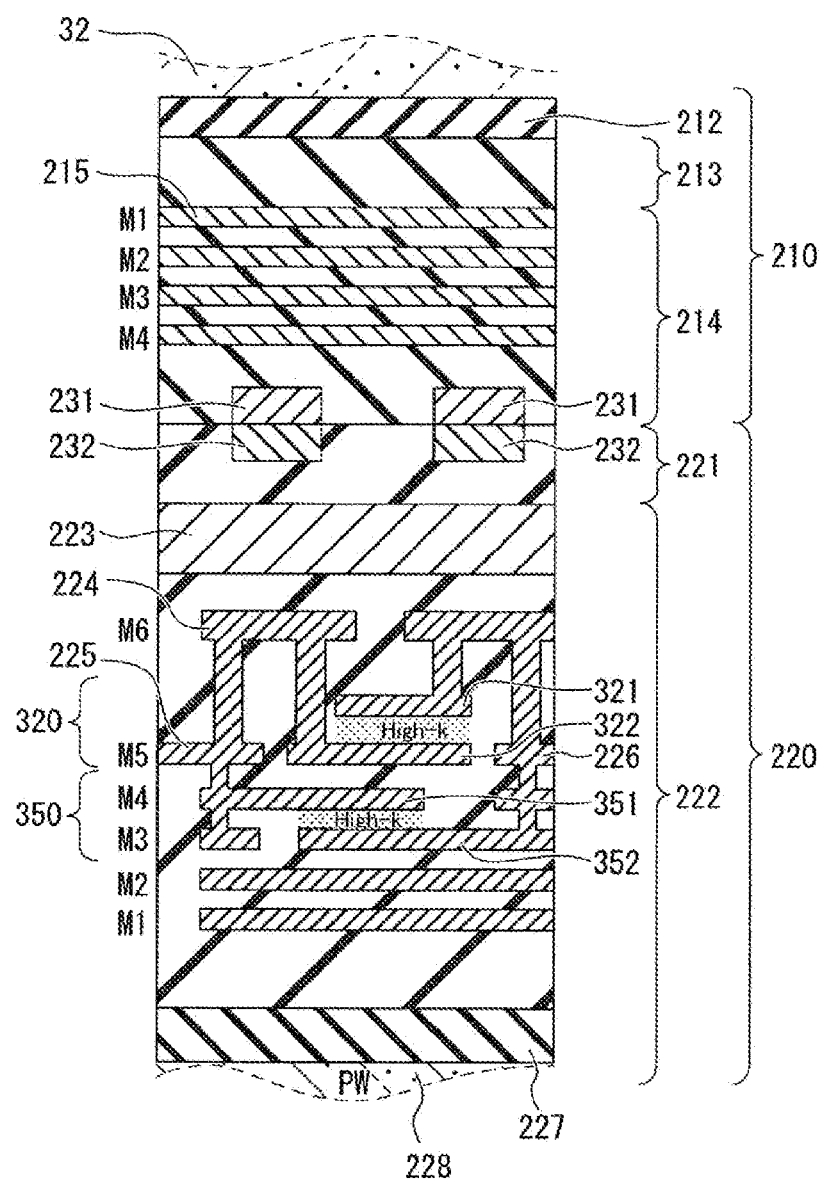
FIG. 20 is a sectional view in a solid-state imaging device according to a third modification of the first embodiment.

FIG. 20 is a sectional view in the solid-state imaging device 100 according to a third modification of the first embodiment. In FIG. 20, same parts as those in FIG. 6(a) described above are designated by same reference signs and detailed descriptions thereof will be omitted.

Figure 21:
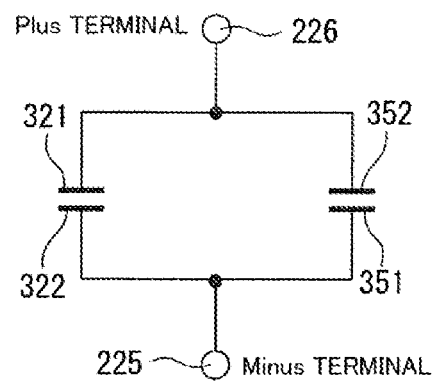
FIG. 21 is an equivalent circuit diagram in which MIM capacitative elements according to the third modification of the first embodiment are connected in parallel to each other.

In FIG. 20, in the solid-state imaging device 100, electrodes of two MIM capacitative elements 320 and 350 formed on different layers are connected in reverse. As shown in FIG. 21, the lower electrode 322 of the MIM capacitative element 320 is connected via the wiring (M4) 224 and the wiring (M6) 224 to an upper electrode 351 of the MIM capacitative element 350. In addition, the upper electrode 321 of the MIM capacitative element 320 is connected via the wiring (M3) 224 and the wiring (M6) 224 to a lower electrode 352 of the MIM capacitative element 350.

Figure 22:
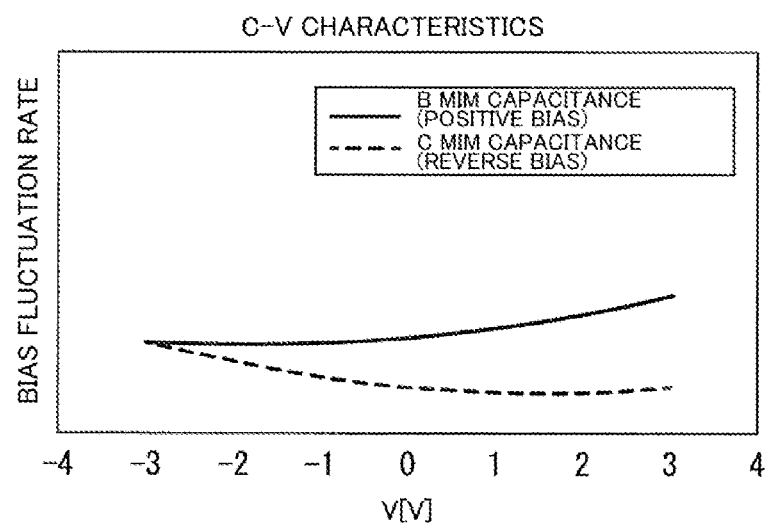
FIG. 22 is a diagram for explaining C-V characteristics when a positive bias and a reverse bias are applied to a MIM capacitative element according to the third modification of the first embodiment.

When the lower electrode 322 of the MIM capacitative element 320 is fixed at 0 V and the potential of the upper electrode 321 is varied between −3 V and 3 V, the sign of the bias dependence of the capacitance value is positive (a solid line B) as shown in FIG. 22. On the other hand, when the upper electrode 351 of the MIM capacitative element 350 is fixed at 0 V and the potential of the lower electrode 352 is varied between −3 V and 3 V, the sign of the bias dependence of the capacitance value is negative (a dotted line C).

Therefore, when the upper electrode 321 of the MIM capacitative element 320 and the lower electrode 352 of the MIM capacitative element 350 are connected to each other, since a sign of bias dependence of a capacitance value differs among elements in the bias dependence of the capacitance value of the capacitative elements connected in parallel, the bias dependence of the capacitance value can be reduced.

<Fourth Modification>

Figure 23:
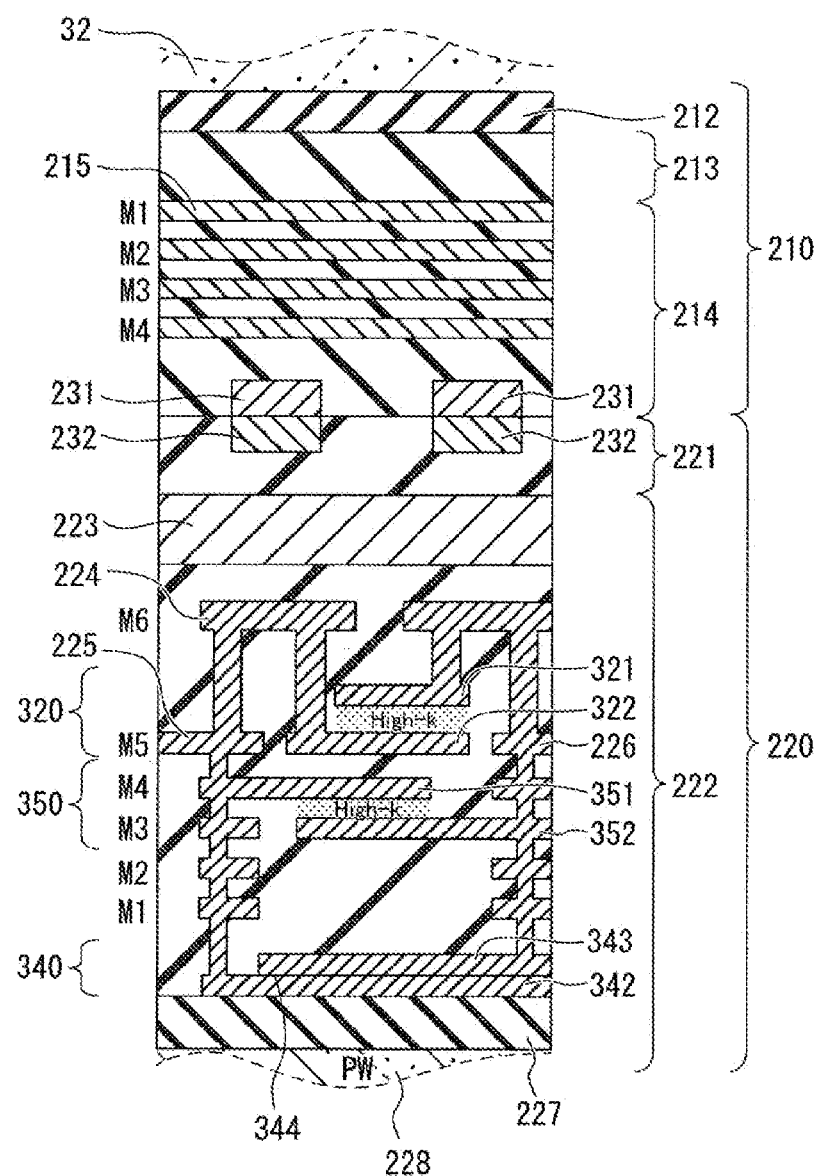
FIG. 23 is a sectional view in a solid-state imaging device according to a fourth modification of the first embodiment.

FIG. 23 is a sectional view in the solid-state imaging device 100 according to a fourth modification of the first embodiment. In FIG. 23, same parts as those in FIG. 6(a) described above are designated by same reference signs and detailed descriptions thereof will be omitted.

In FIG. 23, the solid-state imaging device 100 represents an example of utilizing a PIP (Poly Insulator Poly) capacitative element 340. As shown in FIG. 10, the PIP capacitative element 340 is a capacitative element which uses polycrystalline silicon as an electrode and which is formed by sequentially stacking, for example, N-type polycrystalline Si to be a lower electrode 342, SiO2 to be an insulating film, and N-type polycrystalline Si to be an upper electrode. A feature of the PIP capacitative element 340 is that bias dependence of a capacitance value is low.

Figure 24:
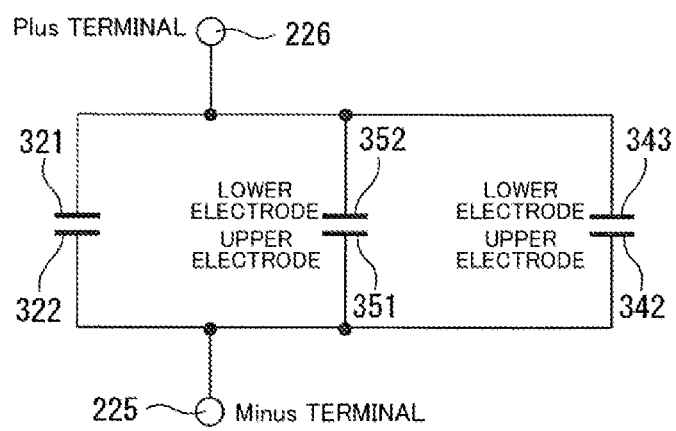
FIG. 24 is an equivalent circuit diagram in which a PIP capacitative element and two MIM capacitative elements according to the fourth modification of the first embodiment are connected in parallel.

As shown in FIG. 24, an upper electrode 343 of the PIP capacitative element 340 is connected via the wiring (M3) 224 to the lower electrode 352 of the MIM capacitative element 350. In addition, the lower electrode 342 of the PIP capacitative element 340 is connected via the wiring (M4) 224 to the upper electrode 351 of the MIM capacitative element 350.

Figure 25:
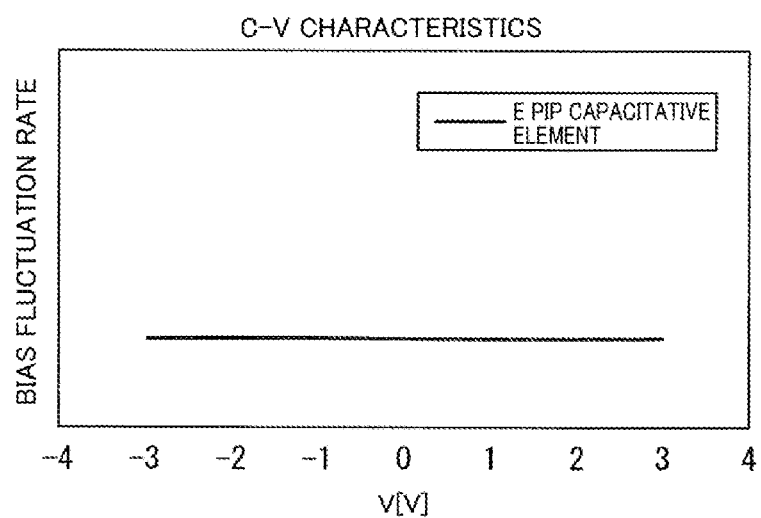
FIG. 25 is a diagram for explaining C-V characteristics of a PIP capacitative element according to the fourth modification of the first embodiment.

Therefore, when applied to the first embodiment of the present disclosure, the PIP capacitative element 340 performs a same role as the MOM capacitative element 330. In other words, by adding the PIP capacitative element 340 as one of the capacitative elements to be connected in parallel, as shown in FIG. 25, a capacitance value of the capacitative elements as a whole can be increased without significantly increasing the bias dependence of the capacitance value of the capacitative elements as a whole. In a connection method when connecting the PIP capacitative element 340 in parallel, any of the lower electrode 342 and the upper electrode 343 may be connected to a positive (Plus) side in a similar manner to the MOM capacitative element 330.

Furthermore, when connecting the N+ accumulation MOS capacitative element 310 and the P+ accumulation MOS capacitative element 360 in parallel, only connecting the upper electrode 313 of the MOS capacitative element 310 to the upper electrode 363 of the MOS capacitative element 360 in parallel and connecting the lower electrode 312 of the MOS capacitative element 310 to the lower electrode 362 of the MOS capacitative element 360 in parallel may suffice.

Second Embodiment

Figure 26:
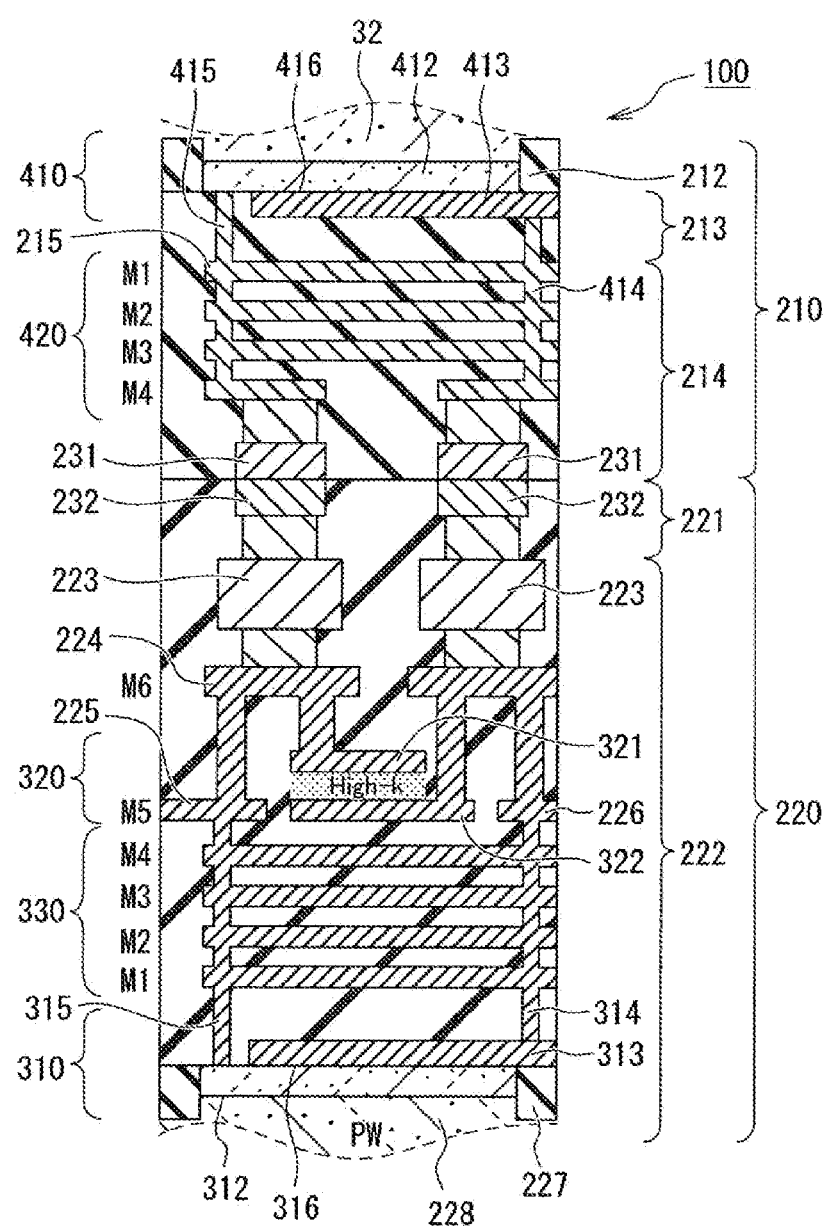
FIG. 26 is a sectional view in a solid-state imaging device according to a second embodiment.

FIG. 26 is a sectional view in the solid-state imaging device 100 according to a second embodiment. In FIG. 26, same parts as those in FIG. 14 described above are designated by same reference signs and detailed descriptions thereof will be omitted.

As the second embodiment, an example in which a plurality of capacitative elements arranged on two different chips are all connected in parallel using a WoW technique will be described.

FIG. 26 represents, in a stacked image sensor, an example which capacitative elements are mounted on chips of both the upper semiconductor substrate 210 and the lower semiconductor substrate 220 and the capacitative elements mounted on the upper semiconductor substrate 210 and the lower semiconductor substrate 220 are connected in parallel using the metal bonding portion 230 arranged on a bonding surface.

In FIG. 26, the upper semiconductor substrate 210 is constituted of, from top to bottom, the p-type well 32, the *glabella* insulating film 213, and the wiring layer 214. An N+ accumulation MOS capacitative element 410 is arranged on a lower side of the upper semiconductor substrate 210. When an electrode of the MOS capacitative element 410 closer to a side of the lower semiconductor substrate 220 on which the MOS capacitative element 410 is mounted is assumed to be a lower electrode 412, the lower electrode 412 is an n-type diffusion layer formed in the p-type well 32, a gate insulating film 416 made of silicon oxide (SiO2) is present on the lower electrode 412, and an upper electrode 413 made of n-type polycrystalline silicon is formed on the gate insulating film 416.

Figure 27:
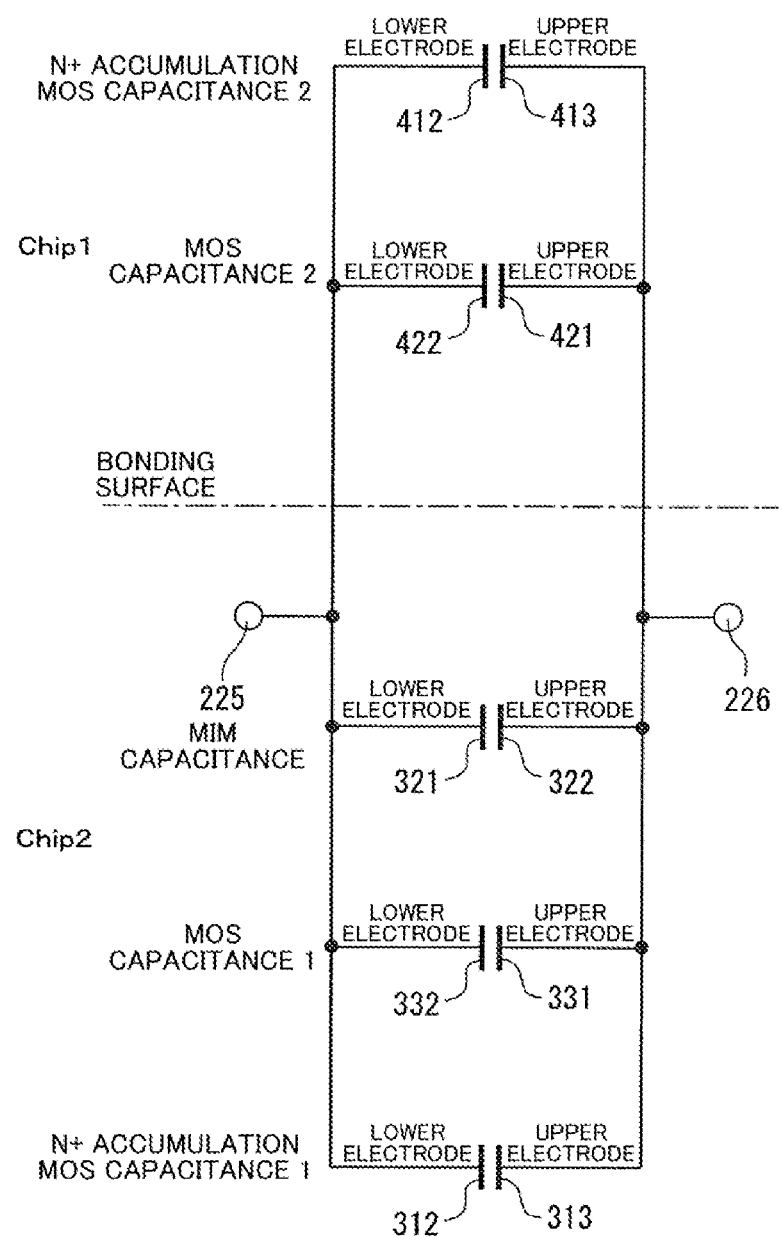
FIG. 27 is an equivalent circuit diagram in which respective capacitative elements according to the second embodiment are connected in parallel.

In a region forming the wirings (M1 to M4) 215 being a layer on an opposite side to the side of the upper semiconductor substrate 210 in a same region where the MOS capacitative element 410 is formed, a MOM capacitative element 420 is formed using the wirings (M1 to M4) 215. In this case, as shown in FIG. 27, an upper electrode 421 of the MOM capacitative element 420 is connected via a via 414 to the upper electrode 413 of the MOS capacitative element 410. In addition, a lower electrode 422 of the MOM capacitative element 420 is connected via a via 415 to the lower electrode 412 of the MOS capacitative element 410.

Furthermore, the upper electrode 413 of the MOS capacitative element 410 and the upper electrode 421 of the MOM capacitative element 420 are connected, via the metal bonding portions 231 and 232 made of copper (Cu), to the upper electrode 313 of the MOS capacitative element 310, the lower electrode 322 of the MIM capacitative element 320, and the upper electrode 331 of the MOM capacitative element 330 on the side of the lower semiconductor substrate 220. In addition, the lower electrode 412 of the MOS capacitative element 410 and the lower electrode 422 of the MOM capacitative element 420 are connected, via the metal bonding portions 231 and 232 made of copper (Cu), to the lower electrode 312 of the MOS capacitative element 310, the upper electrode 321 of the MIM capacitative element 320, and the lower electrode 332 of the MOM capacitative element 330 on the side of the lower semiconductor substrate 220.

Due to such connections, as a sign of bias dependence of a capacitance value of each capacitative element when the negative (Minus) terminal 225 is fixed at 0 V and the positive (Plus) terminal 226 is varied from −3 to 3 V, the N+ accumulation MOS capacitative elements 310 and 410 are positive but the MIM capacitative element 320 is negative. Assuming that the bias dependence of the MOM capacitative elements 330 and 420 is low and negligible, since a sign of a slope of bias dependence of the N+ accumulation MOS capacitative elements 310 and 410 is reverse to that of the MIM capacitative element 320, optimizing element sizes of these elements enables the bias dependence of a capacitance value of a capacitative element formed by connecting these elements in parallel as a whole to be made significantly low.

In addition, by arranging these capacitative elements in a same area, since capacitance values of the MOS capacitative element 410 and the MOM capacitative element 420 of the upper semiconductor substrate 210 (sensor portion) can also be added as compared to the first embodiment, a capacitance value with even higher capacitance density can be formed. For example, in the case of FIG. 26, if a capacitance value of the N+ accumulation MOS capacitative element 310 and the N+ accumulation MOS capacitative element 410 is 100 fF, the capacitance value of the MOM capacitative element 330 and the MOM capacitative element 420 is 30 fF, and the capacitance value of the MIM capacitative element 320 is 100 fF, a total capacitance value of the parallel capacitative elements is 3.6 times the capacitance value when the N+ accumulation MOS capacitative element 310 is used independently.

Operational Advantages Due to Second Embodiment

As described above, according to the second embodiment, by connecting in parallel not only the N+ accumulation MOS capacitative element 310, the MIM capacitative element 320, and the MOM capacitative element 330 mounted on the lower semiconductor substrate 220 but also connecting in parallel the MOS capacitative element 410 and the MOM capacitative element 420 mounted on the upper semiconductor substrate 210, a capacitance value with even higher capacitance density can be formed as compared to the first embodiment.

First Modification of Second Embodiment

Figure 28:
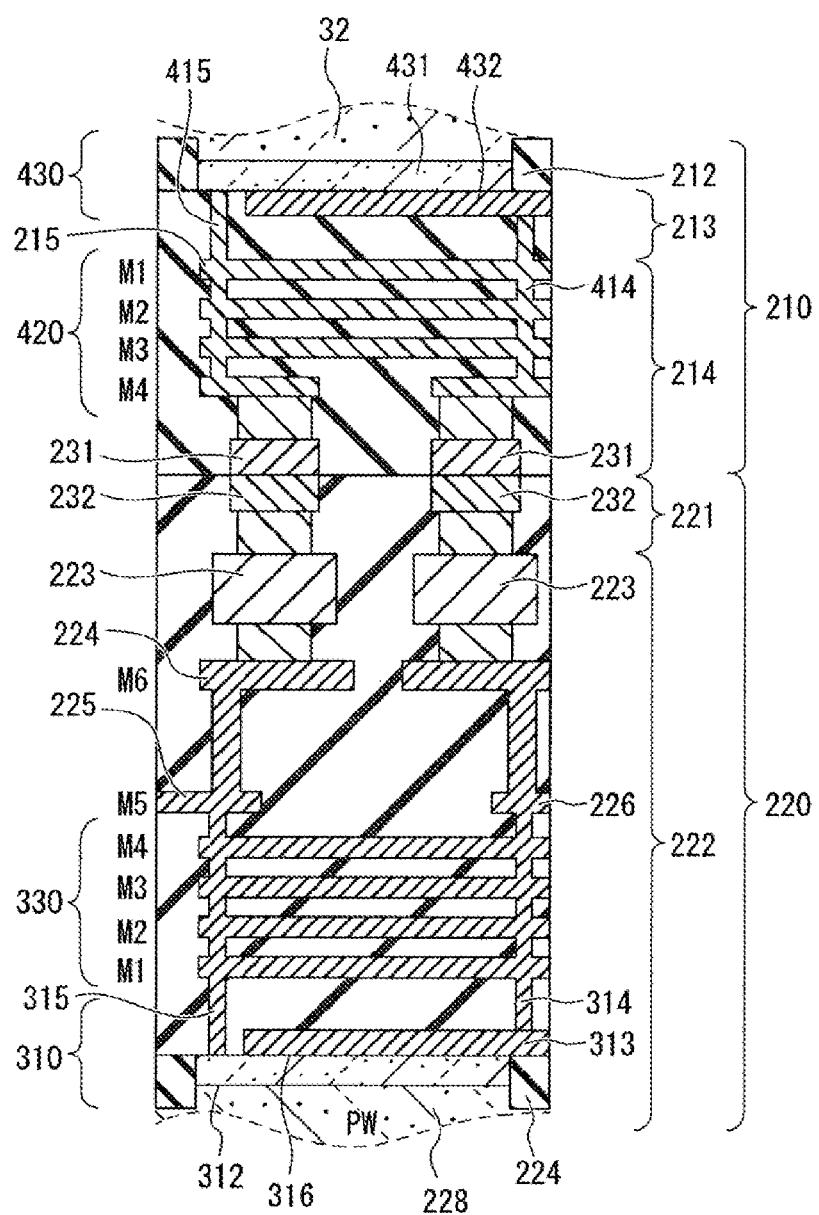
FIG. 28 is a sectional view in a solid-state imaging device according to a first modification of the second embodiment.

FIG. 28 is a sectional view in the solid-state imaging device 100 according to a first modification of the second embodiment. In FIG. 28, same parts as those in FIG. 26 described above are designated by same reference signs and detailed descriptions thereof will be omitted.

In FIG. 28, in the solid-state imaging device 100, the N+ accumulation MOS capacitative element 310 and the MOM capacitative element 330 which are the same as in the first embodiment are mounted to the lower semiconductor substrate 220 (the peripheral circuit portion) and a P+ accumulation MOS capacitative element 430 and the MOM capacitative element 420 are mounted to the upper semiconductor substrate 210 (the sensor portion). In the MOS capacitative element 430, a lower electrode 431 that is close to a side of the upper semiconductor substrate 210 is a p-type diffusion layer, a gate insulating film 436 made of silicon oxide (SiO2) is present on the lower electrode 431, and an upper electrode 432 made of p-type polycrystalline silicon is formed on the gate insulating film 436.

Figure 29:
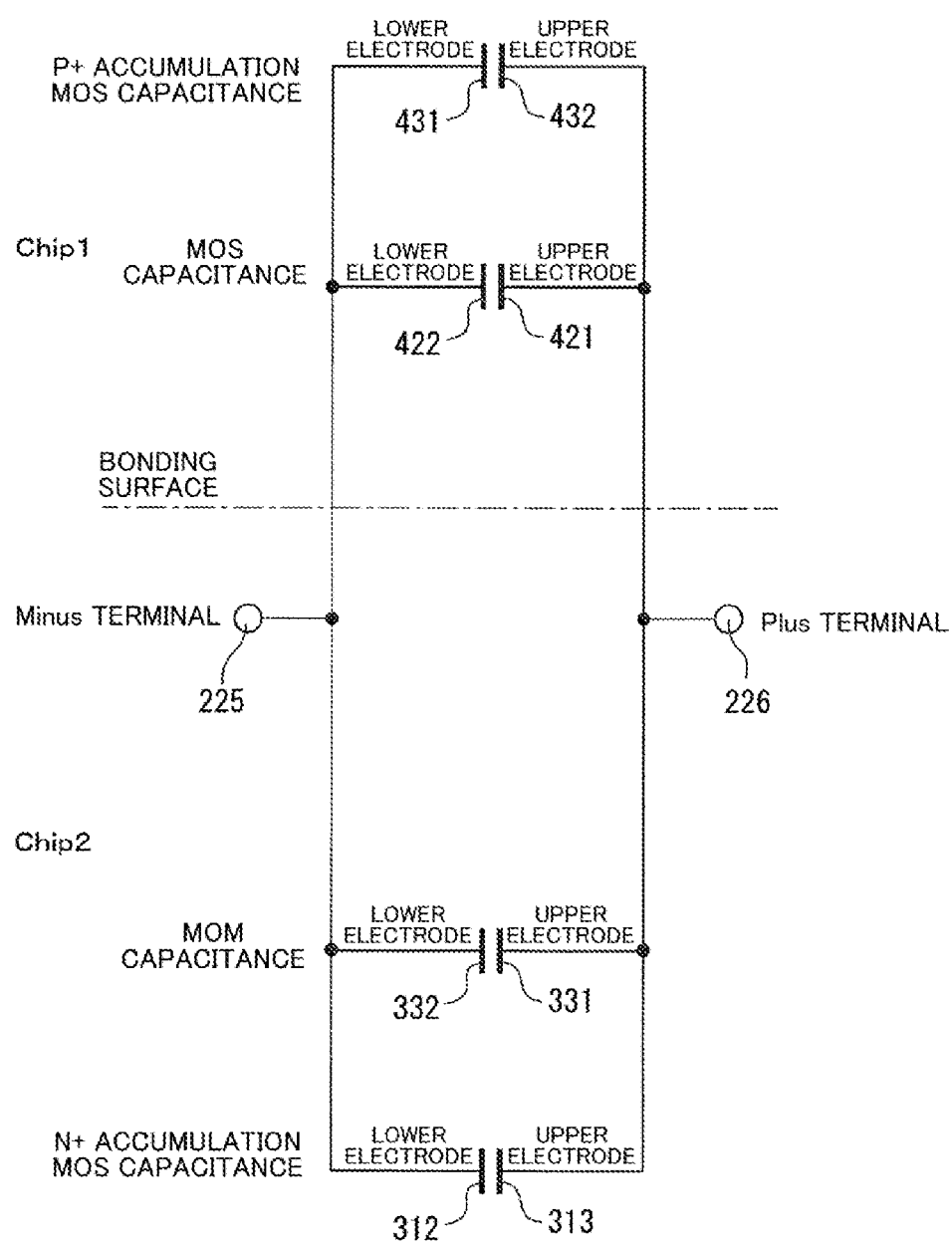
FIG. 29 is an equivalent circuit diagram in which respective capacitive elements according to the first modification of the second embodiment are connected in parallel.

As shown in FIG. 29, the upper electrode 421 of the MOM capacitative element 420 is connected via the via 414 to the upper electrode 432 of the MOS capacitative element 430. In addition, the lower electrode 422 of the MOM capacitative element 420 is connected via the via 415 to the lower electrode 431 of the MOS capacitative element 430.

Furthermore, the upper electrode 432 of the MOS capacitative element 430 and the upper electrode 421 of the MOM capacitative element 420 are connected via the metal bonding portions 231 and 232 made of copper (Cu) to the upper electrode 313 of the MOS capacitative element 310 and the upper electrode 331 of the MOM capacitative element 330 on the side of the lower semiconductor substrate 220. In addition, the lower electrode 431 of the MOS capacitative element 430 and the lower electrode 422 of the MOM capacitative element 420 are connected via the metal bonding portions 231 and 232 made of copper (Cu) to the lower electrode 312 of the MOS capacitative element 310 and the lower electrode 332 of the MOM capacitative element 330 on the side of the lower semiconductor substrate 220.

Operational Advantage Due to First Modification of Second Embodiment

Due to such connections, as a sign of bias dependence of a capacitance value of each capacitative element when the negative (Minus) terminal 225 is fixed at 0 V and the positive (Plus) terminal 226 is varied from −3 to 3 V, the N+ accumulation MOS capacitative elements 310 is positive but the P+ accumulation MOS capacitative element 430 is negative. Assuming that the bias dependence of the MOM capacitative elements 330 and 420 is low and negligible, since signs of a slope of bias dependence of the N+ accumulation MOS capacitative element 310 and the P+ accumulation MOS capacitative element 430 are reverse, optimizing element sizes of these elements enables the bias dependence of a capacitance value of a capacitative element formed by connecting these elements in parallel as a whole to be made significantly low.

Second Modification of Second Embodiment

Figure 30:
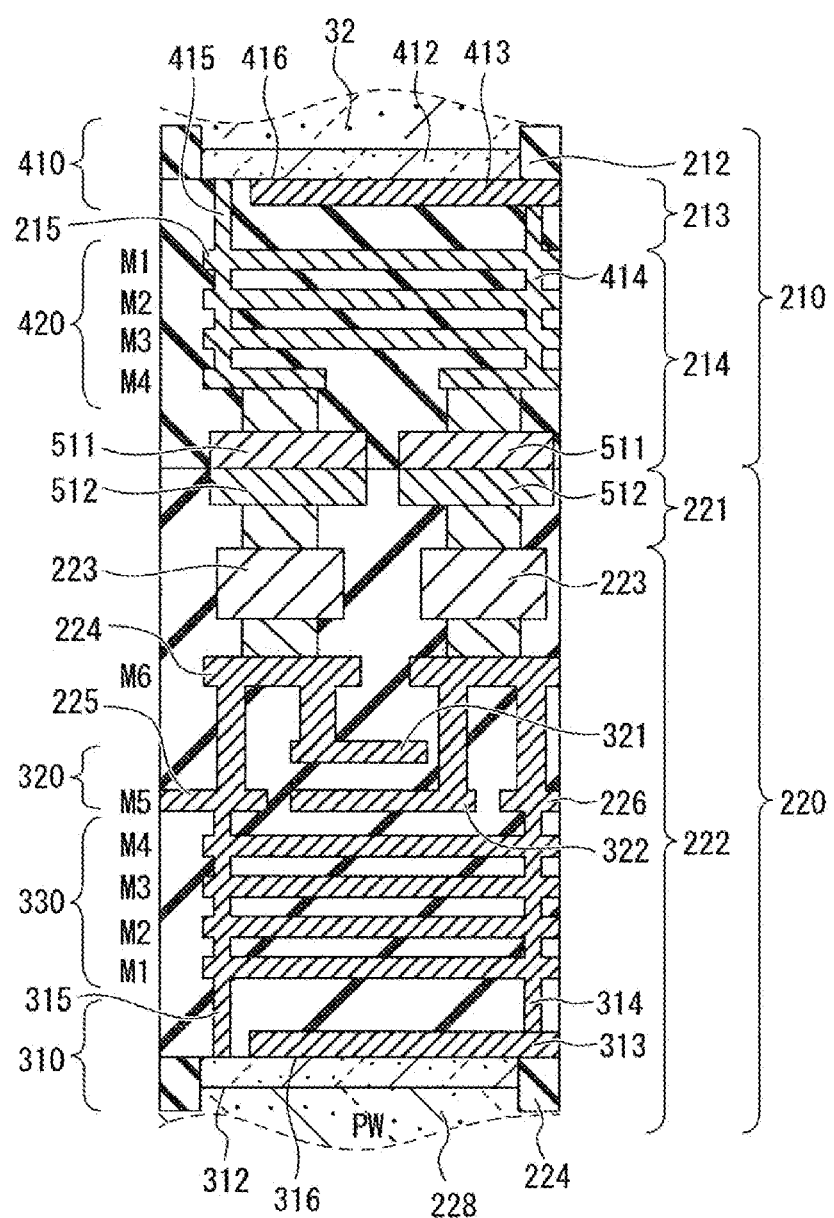
FIG. 30 is a sectional view in a solid-state imaging device according to a second modification of the second embodiment.

FIG. 30 is a sectional view in the solid-state imaging device 100 according to a second modification of the second embodiment. In FIG. 30, same parts as those in FIG. 30 described above are designated by same reference signs and detailed descriptions thereof will be omitted.

In FIG. 30, the solid-state imaging device 100 causes a metal bonding portion 511 on a side of the upper semiconductor substrate 210 and a metal bonding portion 512 on a side of the lower semiconductor substrate 220 arranged on a bonding surface to oppose each other and thereby cause the metal bonding portions 511 and 512 to function as a capacitative element, and connects the capacitative element with other capacitative elements in parallel to further increase capacitance density. This capacitative element will be referred to as a bonding portion capacitative element 510. In this case, the metal bonding portion 511 on the side of the upper semiconductor substrate 210 is assumed to be an upper electrode and the metal bonding portion 512 on the side of the lower semiconductor substrate 220 is assumed to be a lower electrode.

Figure 31:
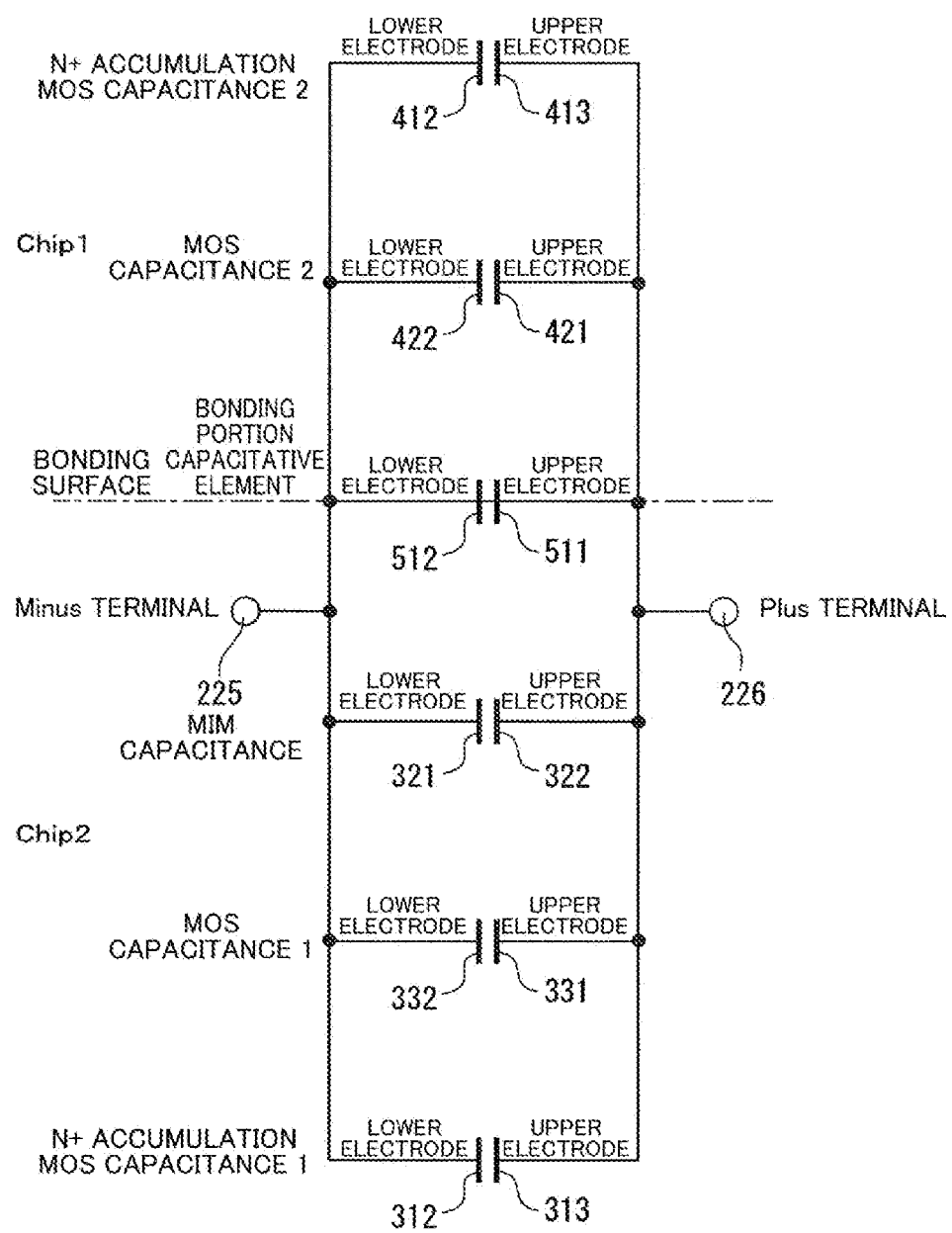
FIG. 31 is an equivalent circuit diagram in which respective capacitive elements according to the second modification of the second embodiment are connected in parallel.

As shown in FIG. 31, the upper electrode (the metal bonding portion 511) of the bonding portion capacitative element 510 is connected via the via 414 to the upper electrode 413 of the MOS capacitative element 410 and the upper electrode 421 of the MOM capacitative element 420. In addition, the lower electrode (the metal bonding portion 512) of the bonding portion capacitative element 510 is connected via the via 415 to the lower electrode 412 of the MOS capacitative element 410 and the lower electrode 422 of the MOM capacitative element 420.

Furthermore, the upper electrode (the metal bonding portion 511) of the bonding portion capacitative element 510 is connected to the upper electrode 313 of the MOS capacitative element 310, the lower electrode 322 of the MIM capacitative element 320, and the upper electrode 331 of the MOM capacitative element 330 on the side of the lower semiconductor substrate 220. In addition, the lower electrode (the metal bonding portion 512) of the bonding portion capacitative element 510 is connected to the lower electrode 312 of the MOS capacitative element 310, the upper electrode 321 of the MIM capacitative element 320, and the lower electrode 332 of the MOM capacitative element 330 on the side of the lower semiconductor substrate 220.

The bonding portion capacitative element 510 has been imparted functions of a capacitative element by simply causing metal materials to oppose each other and bias dependence of a capacitance value is extremely low in a similar manner to the MOM capacitative elements 330 and 420. Therefore, by connecting the bonding portion capacitative element 510 in parallel, capacitance density increases without significantly changing bias dependence of a capacitance value of a capacitative element being a connection source.

Operational Advantage of Second Modification of Second Embodiment

As described above, according to the second modification of the second embodiment, by replacing the metal bonding portions 511 and 512 of the upper semiconductor substrate 210 and the lower semiconductor substrate 220 with the bonding portion capacitative element 510, a capacitance value of the capacitative element as a whole can be increased.

Another Application Example of Second Embodiment

The second embodiment of the present disclosure is not limited to contents described herein. For example, FIG. 32 is a table describing capacitative elements respectively mountable to the upper semiconductor substrate 210 (Chip 1) and the lower semiconductor substrate 220 (Chip 2) using a general CMOS process.

An electrode connection direction in the table shown in FIG. 32 is "forward" when the upper electrode of the respective capacitative elements is connected to a Plus terminal and the lower electrode of the respective capacitative elements is connected to the negative (Minus) terminal 225. Conversely, the electrode connection direction is "opposite" when the upper electrode of the respective capacitative elements is connected to the negative (Minus) terminal 225 and the lower electrode of the respective capacitative elements is connected to the positive (Plus) terminal 226. An element of which a capacitance value has extremely low bias dependence and which can be connected to either terminal without incident is described "ignored".

In addition, a sign of a slope of bias dependence of a capacitance value refers to a sign of the bias dependence of the capacitance value when the negative (Minus) terminal 225 is described to 0 V and the positive (Plus) terminal 226 is varied from −3 to 3 V according to the connection described by the electrode connection direction. From the table shown in FIG. 32, it is obvious that, in a stacked structure in which two chips are stacked, there is an extremely large number of combinations of a plurality of capacitative elements which are connected in parallel according to a desired connection method and which satisfy both capacitance density set as a target and bias dependence of a capacitance value. While all of such combinations cannot be described in the embodiments, a designer may make a best possible choice in consideration of characteristics required by a circuit to be designed, a usable chip area, and a manufacturing cost for mounting each element.

Third Embodiment

Figure 33:
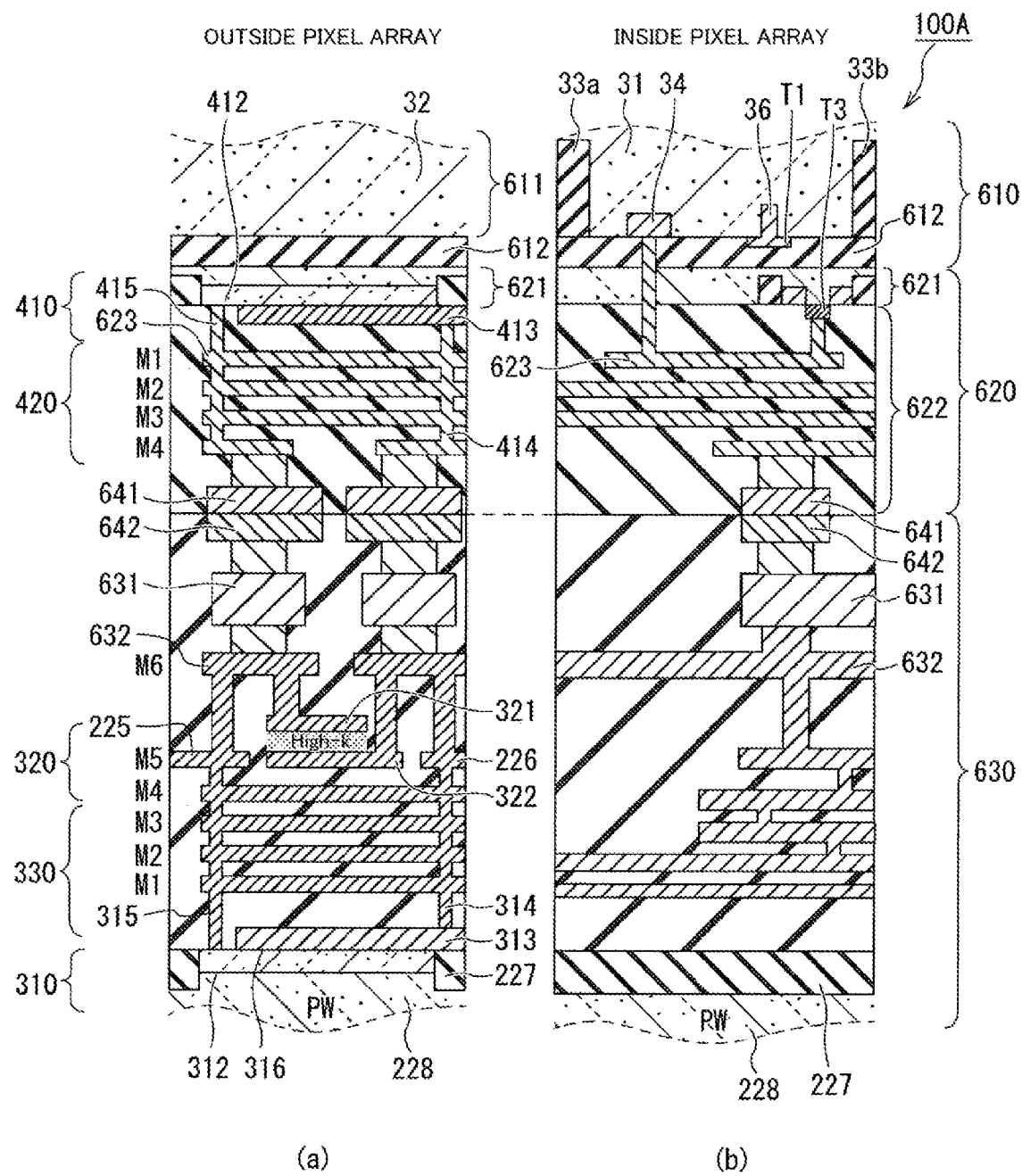
FIG. 33 is a sectional view in a solid-state imaging device according to a third embodiment.

In a third embodiment of the present disclosure, a solid-state imaging device will be described in which a photoelectric conversion element and an amplifying transistor that amplifies a signal from the photoelectric conversion element are arranged on different substrates, and three substrates mounted with a sensor portion in which the photoelectric conversion element and a transfer gate (TRG) are arranged, a pixel transistor portion in which a pixel transistor such as the amplifying transistor is arranged, and a peripheral circuit portion in which a signal processing circuit that processes a signal from the amplifying transistor is arranged are stacked using a WoW technique. FIG. 33 is a sectional view in a solid-state imaging device 100A according to the third embodiment. FIG. 33(a) shows the outside of a pixel and FIG. 33(b) shows the inside of the pixel. In FIG. 33, same parts as those in FIG. 26 described above are designated by same reference signs and detailed descriptions thereof will be omitted.

Figure 34:
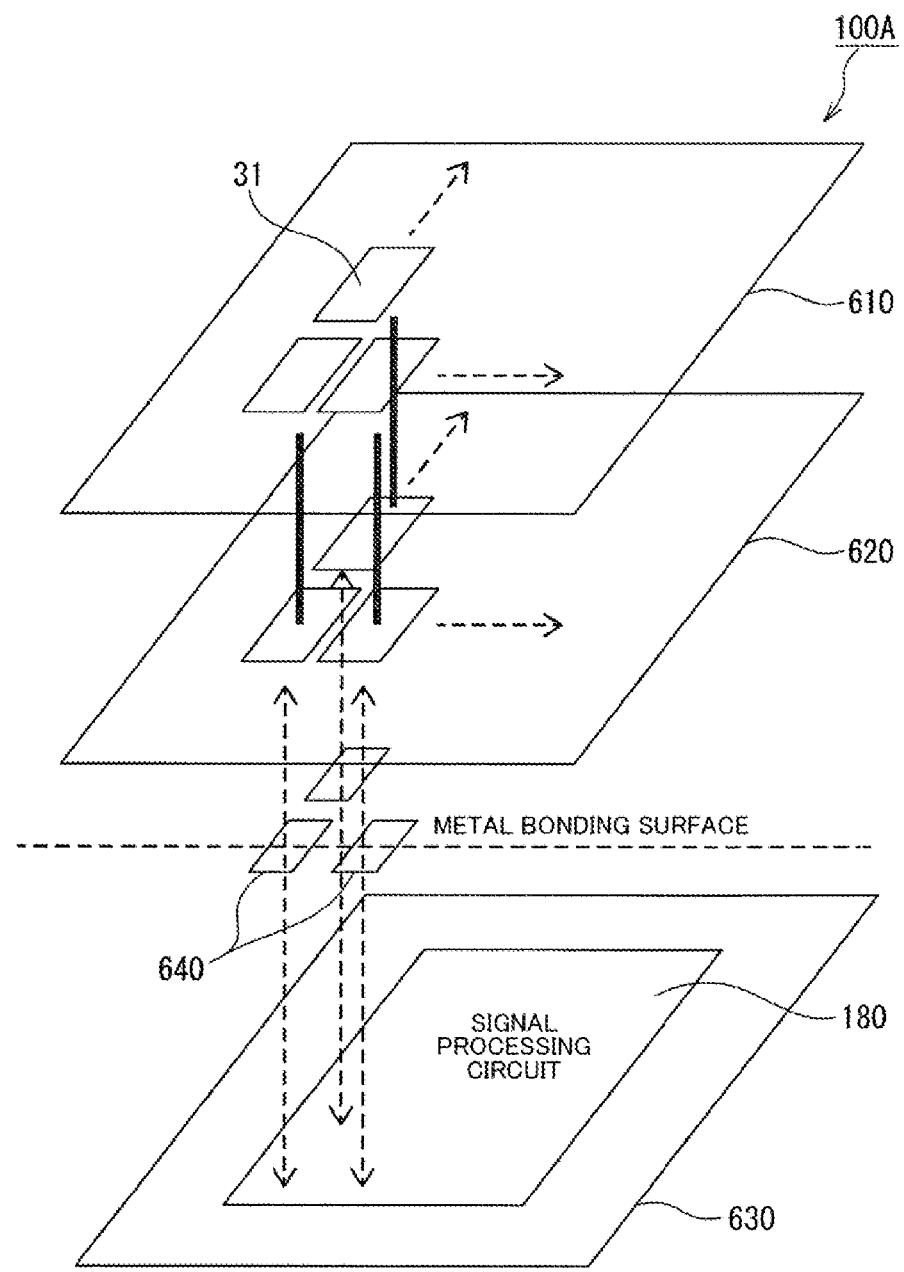
FIG. 34 is a schematic view of a sensor portion, a pixel transistor portion, and a peripheral circuit portion according to the third embodiment.
Figure 35:
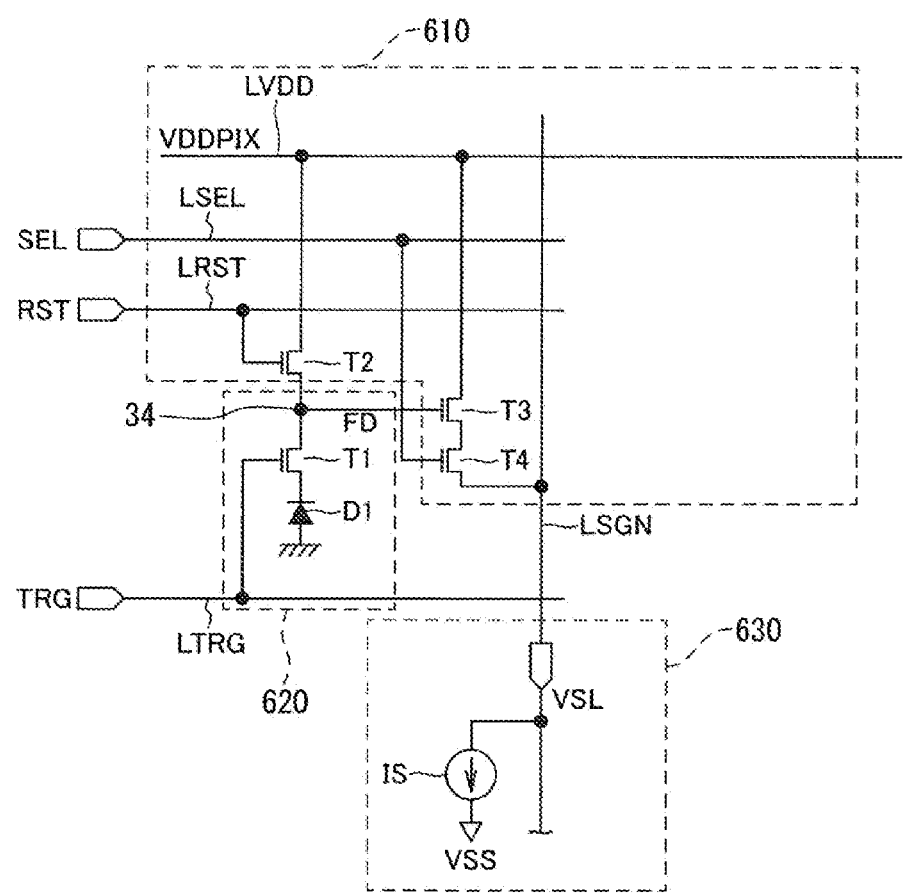
FIG. 35 is an equivalent circuit diagram of a sensor portion, a pixel transistor portion, and a peripheral circuit portion according to the third embodiment.

The solid-state imaging device 100A is constituted of, from top to bottom, a sensor portion 610, a pixel transistor portion 620, and a peripheral circuit portion 630. As shown in FIG. 34, the solid-state imaging device 100A is constituted of a stacked image sensor in which three semiconductor chips being the sensor portion 610, the pixel transistor portion 620, and the peripheral circuit portion 630 are stacked and a part of wirings is electrically connected by a metal bonding portion 640. As shown in FIG. 35, the transfer transistor T1, the photoelectric conversion element D1, and the floating diffusion FD 34 are arranged in the sensor portion 610. The reset transistor T2, the amplifying transistor T3, and the selective transistor T4 are arranged in the pixel transistor portion 620.

Returning to FIG. 33, the sensor portion 610 is constituted of, from top to bottom, the photoelectric conversion layer 611 and a *glabella* insulating film 612. The photoelectric conversion layer 211 is a layer on which the photodiode (PD) 31 is formed and which generates an electric charge in accordance with a light intensity of incident light due to photoelectric conversion. The PD 31 is electrically separated by element separation portions 33a and 33b formed inside the photoelectric conversion layer 611 for each pixel 30. In addition, the FD 34 and a gate electrode 36 of the transfer transistor T1 are formed on the photoelectric conversion layer 611. Note that only the p-type well 32 is present outside of the pixel 30 as shown in FIG. 33(a). The transfer transistor T1 is formed on the *glabella* insulating film 612.

The pixel transistor portion 620 is constituted of, from top to bottom, a p-type well 621 and a wiring layer 622. An n-type diffusion layer is formed in the p-type well 621. The wiring layer 622 is configured to include wirings (M1 to M4) 623 stacked in a plurality of layers. The transfer transistor T1, the reset transistor T2, the amplifying transistor T3, and the selective transistor T4 which constitute each pixel 30 are driven via the plurality of layers of wirings (M1 to M4) 623 formed in the wiring layer 622. In addition, a metal bonding portion 641 made of copper (Cu) is provided inside the wiring layer 622 to be bonded to the peripheral circuit portion 630.

On the other hand, the peripheral circuit portion 630 is constituted of, from top to bottom, a *glabella* insulating film and a wiring layer. The wiring layer is configured to include all wirings 631 and wirings (M1 to M6) 632 stacked in a plurality of layers. In addition, the *glabella* insulating film is provided with a metal bonding portion 642 made of copper (Cu) to be bonded to the metal bonding portion 641 of the pixel transistor portion 620.

In the solid-state imaging device 100A configured as described above, an electric charge is generated as light incident to the sensor portion 610 is photoelectrically converted by the PD 31. In addition, the generated electric charge is output to, via the amplifying transistor T3, the ADC group 150 formed in the peripheral circuit portion 630 as a pixel signal by the signal line LSGN shown in FIG. 1 formed by the wirings (M1 to M4) 623 and wirings (M1 to M6) 632 of the peripheral circuit portion 630.

As shown in FIG. 33(*a*), the N+ accumulation MOS capacitative element 310 is arranged on the peripheral circuit portion 630. The MOM capacitative element 330 and the MIM capacitative element 320 are arranged in a layer above the MOS capacitative element 310.

Figure 36:
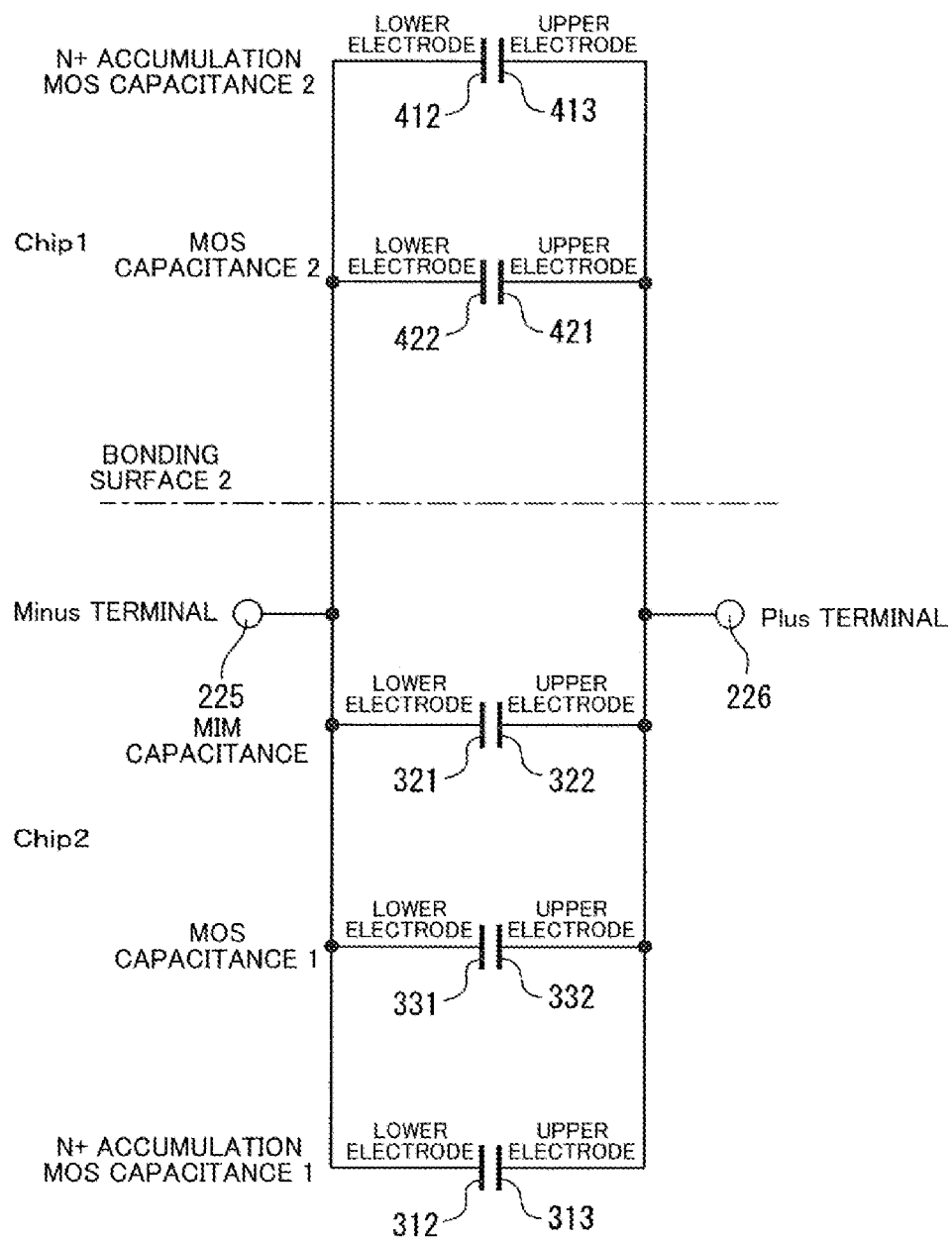
FIG. 36 is an equivalent circuit diagram in which respective capacitive elements according to the third embodiment are connected in parallel.

The N+ accumulation MOS capacitative element 410 is arranged on a lower side of the pixel transistor portion 620. In a region forming the wirings (M1 to M4) 623 being a layer on an opposite side to the side of the pixel transistor portion 620 in a same region where the MOS capacitative element 410 is formed, the MOM capacitative element 420 is formed using the wirings (M1 to M4) 623. In this case, as shown in FIG. 36, the upper electrode 421 of the MOM capacitative element 420 is connected via the via 414 to the upper electrode 413 of the MOS capacitative element 410. In addition, the lower electrode 422 of the MOM capacitative element 420 is connected via the via 415 to the lower electrode 412 of the MOS capacitative element 410.

Furthermore, the upper electrode 413 of the MOS capacitative element 410 and the upper electrode 421 of the MOM capacitative element 420 are connected, via the metal bonding portions 641 and 642 made of copper (Cu), to the upper electrode 313 of the MOS capacitative element 310, the lower electrode 322 of the MIM capacitative element 320, and the upper electrode 331 of the MOM capacitative element 330 on the side of the peripheral circuit portion 630. In addition, the lower electrode 412 of the MOS capacitative element 410 and the lower electrode 422 of the MOM capacitative element 420 are connected, via the metal bonding portions 641 and 642 made of copper (Cu), to the lower electrode 312 of the MOS capacitative element 310, the upper electrode 321 of the MIM capacitative element 320, and the lower electrode 332 of the MOM capacitative element 330 on the side of the peripheral circuit portion 630.

Operational Advantage Due to Third Embodiment

As described above, according to the third embodiment, a similar operational advantage to the second embodiment described above is obtained, and as a sign of bias dependence of a capacitance value of each capacitative element when the negative (Minus) terminal 225 is fixed at 0 V and the positive (Plus) terminal 226 is varied from −3 to 3 V, the N+ accumulation MOS capacitative element 310 and the N+ accumulation MOS capacitative element 410 are positive but the MIM capacitative element 320 is negative as described above in the first embodiment. Assuming that the bias dependence of the MOM capacitative elements 330 and 420 is low and negligible, since a sign of a slope of bias dependence of the N+ accumulation MOS capacitative element 310 and the N+ accumulation MOS capacitative element 410 is reverse to that of the MIM capacitative element 320, optimizing element sizes of these elements enables the bias dependence of a capacitance value of a capacitative element formed by connecting these elements in parallel as a whole to be made significantly low.

As described above, even a three-layer stacked image sensor can be mounted with a capacitative element of which a capacitance value is large and in which bias dependence of the capacitance value is low.

Fourth Embodiment

In a fourth embodiment of the present disclosure, a solid-state imaging device applied to a light detection device using a SPAD (Single Photon Avalanche Diode) will be described.

Figure 37:
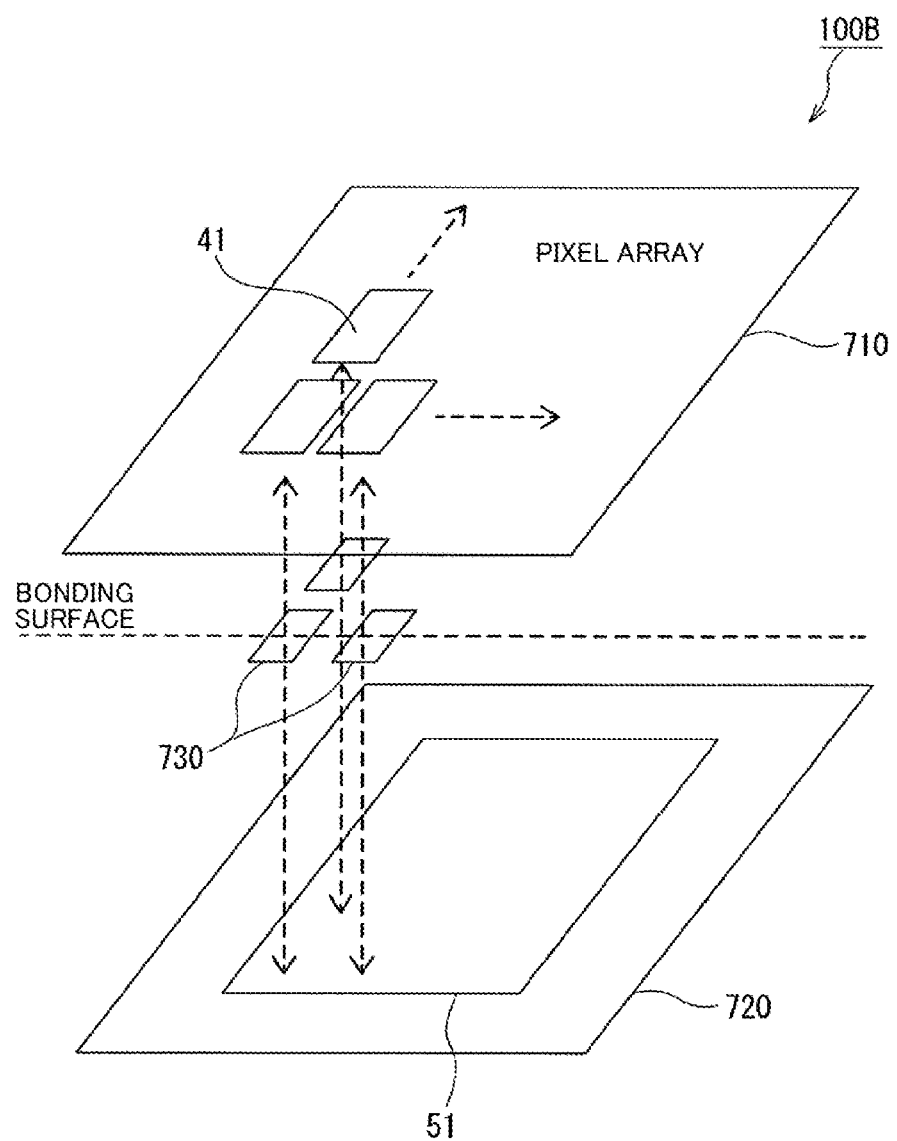
FIG. 37 is an arrangement plan on a semiconductor chip of each circuit constituting a solid-state imaging device according to a fourth embodiment.

FIG. 37 shows an arrangement plan on a semiconductor chip of each circuit constituting a solid-state imaging device 100B according to the fourth embodiment. The solid-state imaging device 100B according to the fourth embodiment is constituted of a stacked image sensor in which two semiconductor chips being an upper semiconductor substrate 710 and a lower semiconductor substrate 720 are stacked and a part of wirings of the upper and lower chips is electrically connected by a metal bonding portion 730 being a TSV (Through-silicon via) or the like. In this case, SPAD photodiodes 41 are arranged in a matrix pattern on the upper semiconductor substrate 710 and peripheral circuits 51 other than the SPAD photodiodes 41 such as the ADC group 150 and the signal processing circuit 180 are mounted to the lower semiconductor substrate 720.

Figure 38:
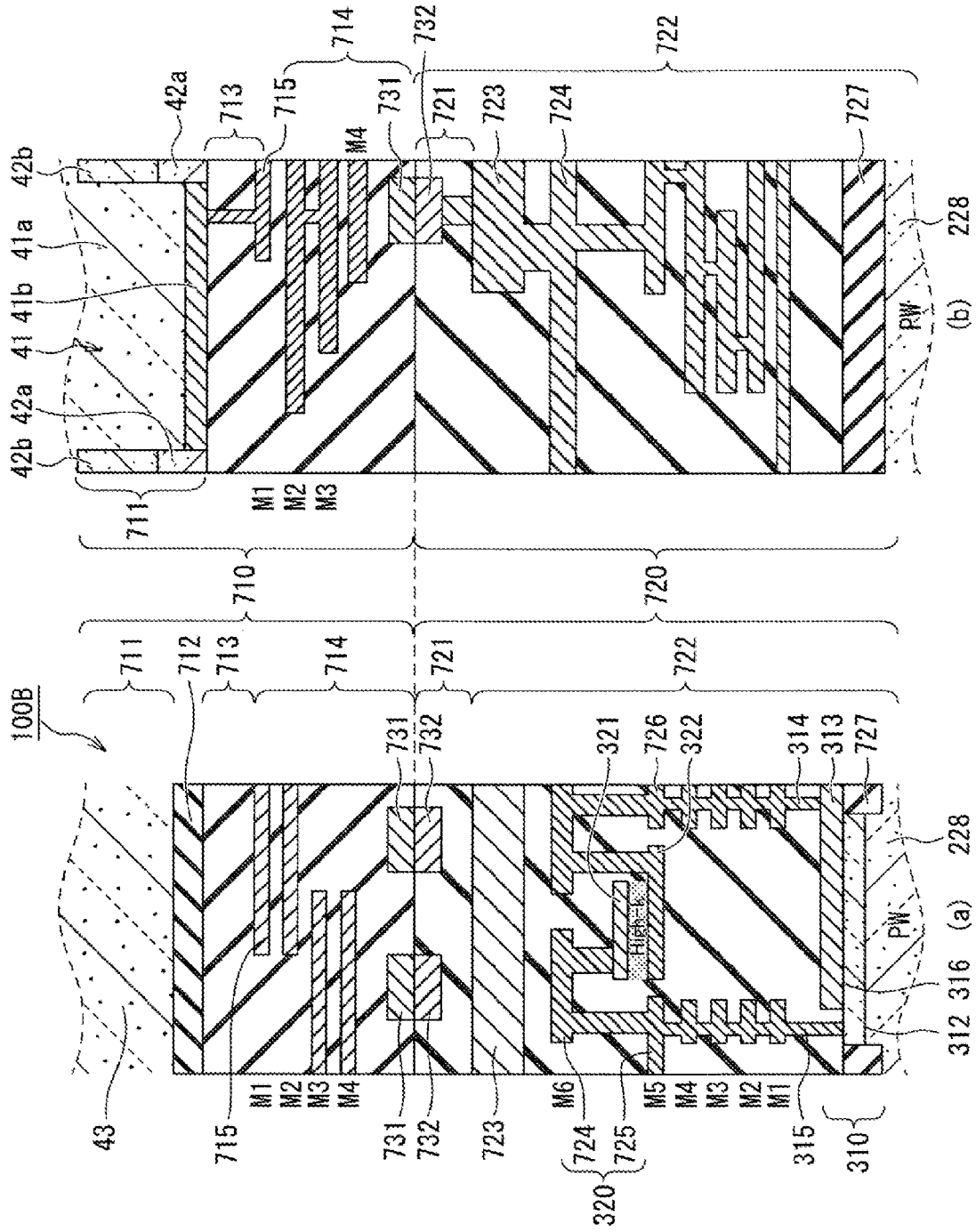
FIG. 38 is a sectional view in a solid-state imaging device according to the fourth embodiment.

FIG. 38 is a sectional view in the solid-state imaging device 100B according to the fourth embodiment. FIG. 38(*a*) shows the outside of a pixel and FIG. 38(*b*) shows the inside of the pixel.

In FIG. 38, the upper semiconductor substrate 710 is constituted of, from top to bottom, a photoelectric conversion layer 711, a *glabella* insulating film 713, and a wiring layer 714. The photoelectric conversion layer 711 is a layer on which the SPAD photodiodes 41 are formed and which detects incident light (photon) and converts a carrier generated from the incident light into an electric signal pulse using avalanche multiplication. The SPAD photodiodes 41 are electrically separated by a p-type diffusion layer 42*a* and an n-type diffusion layer 42*b* formed inside the photoelectric conversion layer 711 for each pixel 30. Note that only a p-type well 43 is present outside of the pixel 30 as shown in FIG. 38(*a*).

The electric signal pulse generated by the SPAD photodiode 41 is output via a via 716 formed in the *glabella* insulating film 713 to wirings (M1 to M4) 715 formed in the wiring layer 714. A metal bonding portion 731 made of copper (Cu) is provided inside the wiring layer 714 to perform bonding with the lower semiconductor substrate 720.

On the other hand, the lower semiconductor substrate 720 is constituted of, from top to bottom, a *glabella* insulating film 721 and a wiring layer 722. The wiring layer 722 is configured to include all wirings 723 and wirings (M1 to M6) 724 stacked in a plurality of layers. In addition, the *glabella* insulating film 721 is provided with a metal bonding portion 732 made of copper (Cu) to be bonded to the metal bonding portion 731 of the upper semiconductor substrate 710.

In the solid-state imaging device 100B configured as described above, an electric signal pulse is generated due to the SPAD photodiode 41 photoelectrically converting light detected by the upper semiconductor substrate 210. In addition, the electric signal pulse is output to the peripheral circuit 51 via the signal line LSGN shown in FIG. 1 being formed by the wirings (M1 to M4) 715 and the wirings (M1 to M6) 724 of the lower semiconductor substrate 720.

As shown in FIG. 38(a), the N+ accumulation MOS capacitative element 310 is arranged on the lower semiconductor substrate 720. The MIM (Metal Insulator Metal) capacitative element 320 formed by stacking the lower electrode 322 positioned near a side closer to the lower semiconductor substrate 220, an insulating film (including a High-K material), and the upper electrode 321 is mounted to a region forming the wirings (M1 to M6) 724 being an upper layer in a same region where the MOS capacitative element 310 is arranged.

Figure 39:
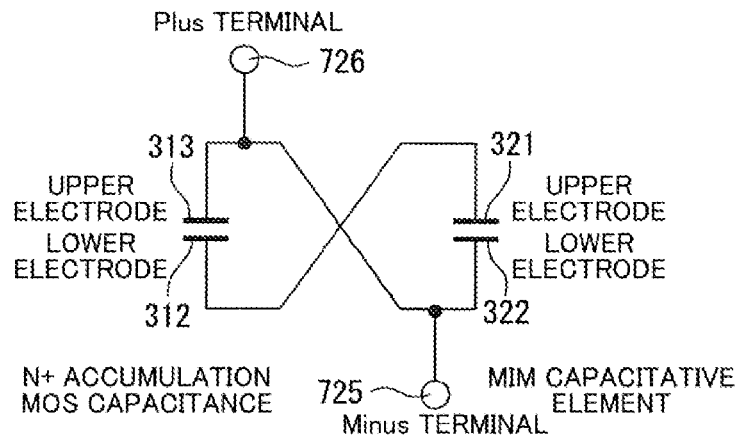
FIG. 39 is an equivalent circuit diagram in which an N+ accumulation MOS capacitive element and a MIM capacitive element according to the fourth embodiment are connected in parallel.

As shown in FIG. 39, two capacitative elements are connected in parallel by connecting the lower electrode 312 of the N+ accumulation MOS capacitative element 310 and the upper electrode 321 of the MIM capacitative element 320 with the via 315 and the wiring (M6) 724 and connecting the upper electrode 313 of the MOS capacitative element 310 and the lower electrode 322 of the MIM capacitative element 320 with the via 314 and the wiring (M5) 724.

Operational Advantage Due to Fourth Embodiment

As described above, according to the fourth embodiment, a similar operational advantage to the first embodiment described earlier is obtained and a capacitative element with high capacitance density and extremely low bias dependence can be realized.

Fifth Embodiment

The first to fourth embodiments exemplify cases where the semiconductor device according to the present technique is applied to a solid-state imaging device being an example of electronic equipment. In a fifth embodiment, a case where the semiconductor device according to the present technique is applied to other electronic equipment will be exemplified.

Figure 40:
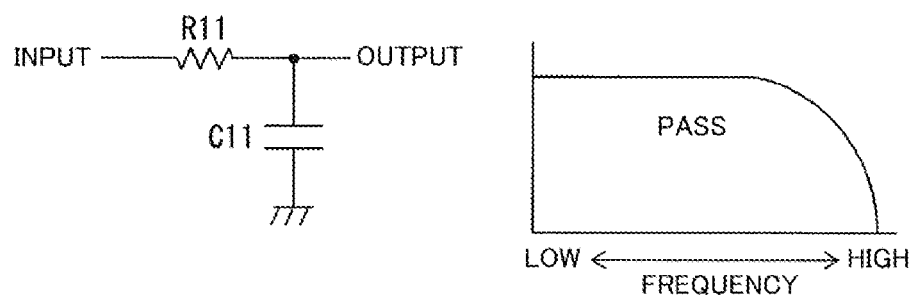
FIG. 40 is an equivalent circuit diagram of a filter circuit according to a fifth embodiment.

For example, the semiconductor device according to the present technique can be applied to a capacitor constituting a general filter circuit. As shown in FIG. 40, a general filter circuit includes a resistor R11 and a capacitor C11 and the semiconductor device according to the present technique can be applied as a component of the capacitor C11. Applying the semiconductor device according to the present technique to the capacitor C11 constituting a filter circuit enables a large capacitance to be realized and a passband to be further widened.

Figure 41:
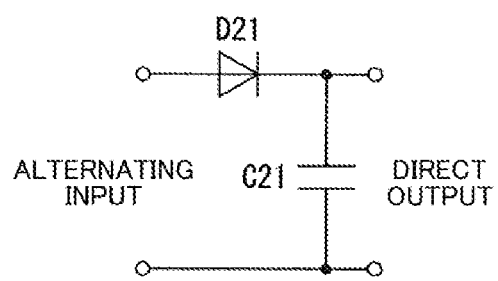
FIG. 41 is an equivalent circuit diagram of a smoothing circuit according to the fifth embodiment.

In addition, the semiconductor device according to the present technique can be applied to a capacitor constituting a general smoothing circuit. As shown in FIG. 41, a general filter circuit includes a diode D21 and a capacitor C21 and the semiconductor device according to the present technique can be applied as a component of the capacitor C21. Applying the semiconductor device according to the present technique to the capacitor C21 constituting a filter circuit enables a large capacitance to be realized and an alternating current to be accurately converted into a direct current.

Figure 42:
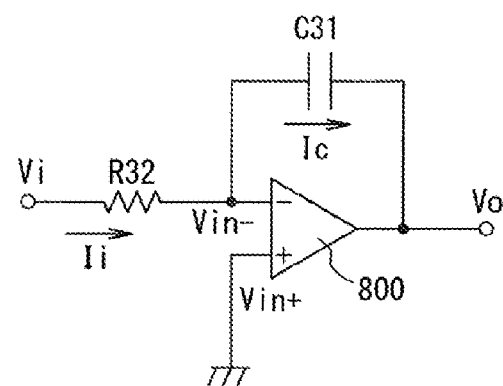
FIG. 42 is an equivalent circuit diagram of an integrator circuit according to the fifth embodiment.

Furthermore, the semiconductor device according to the present technique can be applied to a capacitor constituting a general integrator circuit. As shown in FIG. 42, a general integrator circuit includes a resistor R32, a capacitor C31, and an operational amplifier 800, and the semiconductor device according to the present technique can be applied as a component of the capacitor C31.

Other Embodiments

While the present technique has been described above in the form of the first to fourth embodiments, modifications of the first embodiment, and modifications of the second embodiment, it is not to be understood that the descriptions and drawings that constitute parts of the disclosure limit the present technique. When the purpose of the technical content disclosed by the first to fourth embodiments described above is understood, it will be clear for a person skilled in the art that various alternative embodiments, examples, and operable techniques are included in the present technique. In addition, the configurations respectively disclosed in the first to fourth embodiments, modifications of the first embodiment, and modifications of the second embodiment can be appropriately combined within a range where there is no contradiction. For example, configurations disclosed in a plurality of different embodiments may be combined, or configurations disclosed in a plurality of different modifications of the same embodiment may be combined.

Application Example to Electronic Equipment

Figure 43:
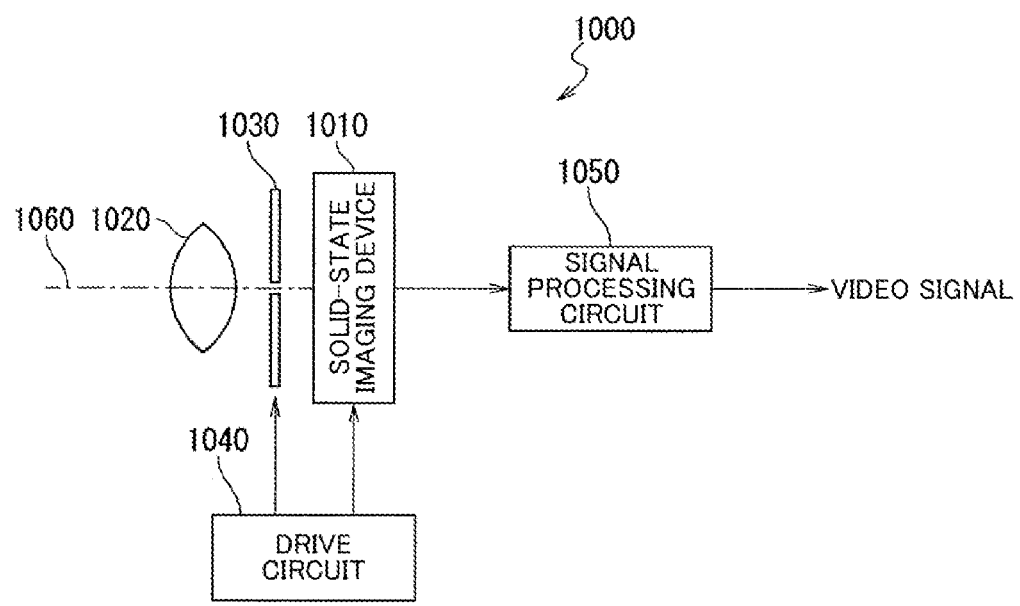
FIG. 43 is a schematic configuration diagram of electronic equipment according to a sixth embodiment.

Next, electronic equipment according to a sixth embodiment of the present disclosure will be described. FIG. 43 is a schematic configuration diagram of electronic equipment 1000 according to the sixth embodiment of the present disclosure.

The electronic equipment 1000 according to the sixth embodiment includes a solid-state imaging device 1010, an optical lens 1020, a shutter device 1030, a drive circuit 1040, and a signal processing circuit 1050. The electronic equipment 1000 according to the sixth embodiment represents an embodiment in a case where the solid-state imaging device 100 according to the first embodiment of the present disclosure is used in electronic equipment (for example, a camera) as the solid-state imaging device 1010.

The optical lens 1020 forms an image of image light (incident light 1060) from a subject on an imaging surface of the solid-state imaging device 1010. As a result, signal charges are accumulated in the solid-state imaging device 1010 over a set period. The shutter device 1030 controls a light irradiation period and a light blocking period to the solid-state imaging device 1010. The drive circuit 1040 supplies a drive signal for controlling a transfer operation of the solid-state imaging device 1010 and a shutter operation of the shutter device 1030. Signal transfer of the solid-state imaging device 1010 is performed by the drive signal (timing signal) supplied from the drive circuit 1040. The signal processing circuit 1050 performs various kinds of signal processing on signals (pixel signals) output from the solid-state imaging device 1010. An image signal having been subjected to signal processing is stored in a storage medium such as a memory or output to a monitor.

According to such a configuration, in the electronic equipment 1000 according to the sixth embodiment, since optical color mixing is suppressed by the solid-state imaging device 1010, image quality of video signals can be improved.

Note that the electronic equipment 1000 to which the solid-state imaging devices 100, 100A, and 100B can be applied is not limited to a camera, and the solid-state imaging devices 100, 100A, and 100B can also be applied to other electronic equipment. For example, the solid-state imaging devices 100, 100A, and 100B may be applied to an imaging device such as a camera module for a mobile device such as a mobile phone.

Further, in the sixth embodiment, while a configuration in which the solid-state imaging devices 100, 100A, and 100B according to the first to fourth embodiments are used in electronic equipment has been adopted as the solid-state imaging device 1010, other configurations may be adopted.

In addition, the present disclosure can also adopt the following configurations.

(1)

A semiconductor device, including:
a semiconductor substrate;
a first capacitative element stacked on the semiconductor substrate; and
a second capacitative element which is stacked on an opposite side to a side of the semiconductor substrate of the first capacitative element and of which a capacitance value has bias characteristics being opposite to bias characteristics of a capacitance value of the first capacitative element, wherein
the first capacitative element and the second capacitative element are connected in parallel.

(2)

The semiconductor device according to (1), wherein
n (where n is an integer)-number of the first and second capacitative elements are provided, and
the n-number of capacitative elements are connected in parallel such that, when a capacitance value of the elements as a whole when a potential difference between electrodes is equal to an operating voltage is denoted by Ctotal(V), a capacitance value of the elements as a whole when the potential difference between electrodes is 0 is denoted by Ctotal(0) a bias dependence coefficient (including positive or negative) of a capacitance value of each capacitative element is denoted by An, an element size of each capacitative element is denoted by Sn, and a capacitance density of each capacitative element is denoted by Cn(V), bias characteristics of a capacitance value of the capacitative elements as a whole $$Ctotal(V)/Ctotal(0)=\Sigma An*Cn(V)*Sn/Ctotal(0)$$

most closely approaches 1.

(3)

The semiconductor device according to (1) or (2), wherein
the first capacitative element is a first conductivity-type accumulation MOS capacitative element having a lower electrode formed on a side of the semiconductor substrate and an upper electrode which opposes the lower electrode across an insulating film,
the second capacitative element is a second conductivity-type accumulation MOS capacitative element having a lower electrode formed on a side of the semiconductor substrate and an upper electrode which opposes the lower electrode across an insulating film, the second conductivity type being a polarity reverse to that of the first conductivity type, and
the semiconductor device includes a parallel connection structure in which the upper electrode of the first conductivity-type accumulation MOS capacitative element and the upper electrode of the second conductivity-type accumulation MOS capacitative element are connected to each other and the lower electrode of the first conductivity-type accumulation MOS capacitative element and the lower electrode of the second conductivity-type accumulation MOS capacitative element are connected to each other.

(4)

The semiconductor device according to (1) or (2), wherein
the first capacitative element is a first conductivity-type accumulation MOS capacitative element having a lower electrode formed on a side of the semiconductor substrate and an upper electrode which opposes the lower electrode across an insulating film,
the second capacitative element is a MIM (Metal Insulator Metal) capacitative element having a lower electrode formed on a side of the semiconductor substrate and an upper electrode which opposes the lower electrode across an insulating film, and
the semiconductor device includes a parallel connection structure in which the upper electrode of the first conductivity-type accumulation MOS capacitative element and the lower electrode of the MIM capacitative element are connected to each other and the lower electrode of the first conductivity-type accumulation MOS capacitative element and the upper electrode of the MIM capacitative element are connected to each other.

(5)

The semiconductor device according to (1) or (2), wherein
the first capacitative element is a second conductivity-type accumulation MOS capacitative element having a lower electrode formed on a side of the semiconductor substrate and an upper electrode which opposes the lower electrode across an insulating film, the second conductivity type being a polarity reverse to that of the first conductivity type,
the second capacitative element is a MIM capacitative element having a lower electrode formed on a side of the semiconductor substrate and an upper electrode which opposes the lower electrode across an insulating film, and
the semiconductor device includes a parallel connection structure in which the upper electrode of the second conductivity-type accumulation MOS capacitative element and the upper electrode of the MIM capacitative element are connected to each other and the lower electrode of the second conductivity-type accumulation MOS capacitative element and the lower electrode of the MIM capacitative element are connected to each other.

(6)

The semiconductor device according to (1) or (2), wherein
the first capacitative element is a first MIM capacitative element having a lower electrode formed on a side of the semiconductor substrate and an upper electrode which opposes the lower electrode across an insulating film,
the second capacitative element is a second MIM capacitative element having a lower electrode formed on a side of the semiconductor substrate and an upper electrode which opposes the lower electrode across an insulating film, and the semiconductor device includes a parallel connection structure in which the upper electrode of the first MIM capacitative element and the lower electrode of the second MIM capacitative element are connected to each other and the lower electrode of the first MIM capacitative element and the upper electrode of the second MIM capacitative element are connected to each other.

(7)

The semiconductor device according to any one of (1) to (6), further including:
a structure in which a comb-shaped wiring capacitative element is connected in parallel.

(8)

The semiconductor device according to any one of (1) to (7), further including:
a structure in which a PIP (Poly Insulator Poly) capacitative element is connected in parallel.

(9)

The semiconductor device according to any one of (1) to (8), further including; another semiconductor substrate having a third capacitative element, wherein the other semiconductor substrate is bonded to the semiconductor substrate, and the first capacitative element, the second capacitative element, and the third capacitative element are connected in parallel so that bias characteristics of a capacitance value of the capacitative elements as a whole most closely approaches 1.

(10)

The semiconductor device according to (9), wherein the semiconductor device includes a structure in which a bonding portion of the semiconductor substrate and the other semiconductor substrate is a capacitative element.

(11)

The semiconductor device according to (9) or (10), wherein
the semiconductor substrate has at least one of a pixel and a peripheral circuit configured to process a signal from a pixel transistor configured to amplify a signal from the pixel, and
the other semiconductor substrate has the other of the pixel and the peripheral circuit.

(12)

The semiconductor device according to (11), wherein the pixel is made of a photodiode, and
the semiconductor substrate having the peripheral circuit is made up of a first semiconductor substrate having the pixel transistor and a second semiconductor substrate having the peripheral circuit.

(13)

The semiconductor device according to (9) or (10), wherein
the semiconductor substrate has at least one of a sensor portion having a SPAD (Single Photon Avalanche Diode) photodiode and a peripheral circuit configured to process a signal from the sensor portion, and
the other semiconductor substrate has the other of the sensor portion and the peripheral circuit.

(14)

Electronic equipment, including;
a semiconductor device including;
a semiconductor substrate;
a first capacitative element stacked on the semiconductor substrate; and
a second capacitative element which is stacked on an opposite side to a side of the semiconductor substrate of the first capacitative element and of which a capacitance value has bias characteristics being opposite to bias characteristics of a capacitance value of the first capacitative element, wherein
the first capacitative element and the second capacitative element are connected in parallel.

REFERENCE SIGNS LIST

30 Pixel
31 Constant-current source load
32, 43, 621 p-type well
33a, 33b, 33c Element separation portion
35, 42b n-type diffusion layer
36 Gate electrode
41 SPAD photodiode
42a p-type diffusion layer
51 Peripheral circuit
100, 100A, 100B, 1010 Solid-state imaging device 110 Pixel array portion
120 Row selection circuit
130 Horizontal transfer/scan circuit
140 Timing control circuit
150 ADC group
151 Comparator
152 Counter
153 Latch
170 Amplifier circuit
180, 1050 Signal processing circuit
190 Horizontal transfer line
210, 710 Upper semiconductor substrate
211, 611, 711 Photoelectric conversion layer
213, 221, 612, 713, 721 Glabella insulating film
215, 223, 224, 623, 631, 632, 715, 723, 724 Wiring
214, 222, 622, 714, 722 Wiring layer
220, 720 Lower semiconductor substrate
225 Negative terminal
226 Positive terminal
230, 231, 232, 511, 512, 640, 641, 642, 730, 731, 732 Metal bonding portion
310, 360 MOS capacitative element
312, 322, 332 Lower electrode
313, 321, 331 Upper electrode
314, 315, 716 Via
316, 366 Gate insulating film
320, 350 MIM capacitative element
330 MOM capacitative element
340 PIP capacitative element
610 Sensor portion
620 Pixel transistor portion
630 Peripheral circuit portion
800 Operational amplifier
1000 Electronic equipment
1020 Optical lens
1030 Shutter device
1040 Drive circuit
1060 Incident light

What is claimed is:

1. A semiconductor device, comprising:
a semiconductor substrate;
a first capacitative element stacked on the semiconductor substrate; and
a second capacitative element that is stacked on a side of the semiconductor substrate opposite to a side on which the first capacitative element is stacked,
wherein a capacitance value of the second capacitative element has bias characteristics that are opposite to bias characteristics of a capacitance value of the first capacitative element, and
wherein the first capacitative element and the second capacitative element are connected in parallel,
wherein, where n is an integer, n-number of the first and second capacitative elements are provided, and
wherein the n-number of capacitative elements are connected in parallel such that, when a capacitance value of the elements as a whole when a potential difference between electrodes is equal to an operating voltage is denoted by Ctotal(V), a capacitance value of the elements as a whole when the potential difference between electrodes is 0 is denoted by Ctotal(0), a bias dependence coefficient including positive or negative of a capacitance value of each capacitative element is denoted by An, an element size of each capacitative element is denoted by Sn, and a capacitance density of each capacitative element is denoted by Cn(V), bias characteristics of a capacitance value of the capacitative elements as a whole $$Ctotal(V)/Ctotal(0)=\Sigma An*Cn(V)*Sn/Ctotal(0)$$

most closely approaches 1.

2. A semiconductor device, comprising:
a semiconductor substrate;
a first capacitative element stacked on the semiconductor substrate; and
a second capacitative element that is stacked on a side of the semiconductor substrate opposite to a side on which the first capacitative element is stacked,
wherein a capacitance value of the second capacitative element has bias characteristics that are opposite to bias characteristics of a capacitance value of the first capacitative element, and
wherein the first capacitative element and the second capacitative element are connected in parallel,
wherein the first capacitative element is a first conductivity-type accumulation MOS capacitative element having a lower electrode formed on a side of the semiconductor substrate and an upper electrode which opposes the lower electrode across an insulating film,
wherein the second capacitative element is a second conductivity-type accumulation MOS capacitative element having a lower electrode formed on a side of the semiconductor substrate and an upper electrode which opposes the lower electrode across an insulating film, the second conductivity-type being a polarity reverse to that of the first conductivity-type, and
wherein the semiconductor device includes a parallel connection structure in which the upper electrode of the first conductivity-type accumulation MOS capacitative element and the upper electrode of the second conductivity-type accumulation MOS capacitative element are connected to each other and the lower electrode of the first conductivity-type accumulation MOS capacitative element and the lower electrode of the second conductivity-type accumulation MOS capacitative element are connected to each other.

3. A semiconductor device, comprising:
a semiconductor substrate;
a first capacitative element stacked on the semiconductor substrate; and
a second capacitative element that is stacked on a side of the semiconductor substrate opposite to a side on which the first capacitative element is stacked,
wherein a capacitance value of the second capacitative element has bias characteristics that are opposite to bias characteristics of a capacitance value of the first capacitative element, and
wherein the first capacitative element and the second capacitative element are connected in parallel,
wherein the first capacitative element is a first conductivity-type accumulation MOS capacitative element having a lower electrode formed on a side of the semiconductor substrate and an upper electrode which opposes the lower electrode across an insulating film,
wherein the second capacitative element is a metal insulator metal (MIM) capacitative element having a lower electrode formed on a side of the semiconductor substrate and an upper electrode which opposes the lower electrode across an insulating film, and
wherein the semiconductor device includes a parallel connection structure in which the upper electrode of the first conductivity-type accumulation MOS capacitative element and the lower electrode of the MIM capacitative element are connected to each other and the lower electrode of the first conductivity-type accumulation MOS capacitative element and the upper electrode of the MIM capacitative element are connected to each other.

4. A semiconductor device, comprising:
a semiconductor substrate;
a first capacitative element stacked on the semiconductor substrate; and
a second capacitative element that is stacked on a side of the semiconductor substrate opposite to a side on which the first capacitative element is stacked,
wherein a capacitance value of the second capacitative element has bias characteristics that are opposite to bias characteristics of a capacitance value of the first capacitative element, and
wherein the first capacitative element and the second capacitative element are connected in parallel,
wherein the first capacitative element is a second conductivity-type accumulation MOS capacitative element having a lower electrode formed on a side of the semiconductor substrate and an upper electrode which opposes the lower electrode across an insulating film, the second conductivity-type being a polarity reverse to that of a first conductivity-type,
wherein the second capacitative element is a MIM capacitative element having a lower electrode formed on a side of the semiconductor substrate and an upper electrode that opposes the lower electrode across an insulating film, and
wherein the semiconductor device includes a parallel connection structure in which the upper electrode of the second conductivity-type accumulation MOS capacitative element and the upper electrode of the MIM capacitative element are connected to each other and the lower electrode of the second conductivity-type accumulation MOS capacitative element and the lower electrode of the MIM capacitative element are connected to each other.

5. A semiconductor device, comprising:
a semiconductor substrate;
a first capacitative element stacked on the semiconductor substrate; and
a second capacitative element that is stacked on a side of the semiconductor substrate opposite to a side on which the first capacitative element is stacked,
wherein a capacitance value of the second capacitative element has bias characteristics that are opposite to bias characteristics of a capacitance value of the first capacitative element, and
wherein the first capacitative element and the second capacitative element are connected in parallel,
wherein the first capacitative element is a first MIM capacitative element having a lower electrode formed on a side of the semiconductor substrate and an upper electrode which opposes the lower electrode across an insulating film,
wherein the second capacitative element is a second MIM capacitative element having a lower electrode formed on a side of the semiconductor substrate and an upper electrode which opposes the lower electrode across an insulating film, and
wherein the semiconductor device includes a parallel connection structure in which the upper electrode of the first MIM capacitative element and the lower electrode of the second MIM capacitative element are connected to each other and the lower electrode of the first MIM capacitative element and the upper electrode of the second MIM capacitative element are connected to each other.

6. The semiconductor device according to claim 1, further including:
a structure in which a comb-shaped wiring capacitative element is connected in parallel.

7. The semiconductor device according to claim 1, further including:
a structure in which a poly insulator poly capacitative element is connected in parallel.

8. A semiconductor device, comprising:
a semiconductor substrate;
a first capacitative element stacked on the semiconductor substrate;
a second capacitative element that is stacked on a side of the semiconductor substrate opposite to a side on which the first capacitative element is stacked,
wherein a capacitance value of the second capacitative element has bias characteristics that are opposite to bias characteristics of a capacitance value of the first capacitative element, and
wherein the first capacitative element and the second capacitative element are connected in parallel; and
another semiconductor substrate having a third capacitative element,
wherein the other semiconductor substrate is bonded to the semiconductor substrate, and the first capacitative element, the second capacitative element, and the third capacitative element are connected in parallel so that bias characteristics of a capacitance value of the capacitative elements as a whole approaches 1.

9. The semiconductor device according to claim 8, wherein
the semiconductor device includes a structure in which a bonding portion of the semiconductor substrate and the other semiconductor substrate is a capacitative element.

10. The semiconductor device according to claim 8, wherein
the semiconductor substrate has at least one of a pixel and a peripheral circuit configured to process a signal from a pixel transistor configured to amplify a signal from the pixel, and
the other semiconductor substrate has the other of the pixel and the peripheral circuit.

11. The semiconductor device according to claim 10, wherein
the pixel is made of a photodiode, and
the semiconductor substrate having the peripheral circuit is made up of a first semiconductor substrate having the pixel transistor and a second semiconductor substrate having the peripheral circuit.

12. The semiconductor device according to claim 8, wherein
the semiconductor substrate has at least one of a sensor portion having a single photon avalanche diode photodiode and a peripheral circuit configured to process a signal from the sensor portion, and
the other semiconductor substrate has the other of the sensor portion and the peripheral circuit.

13. The semiconductor device according to claim 2, further including:
a structure in which a comb-shaped wiring capacitative element is connected in parallel.

14. The semiconductor device according to claim 2, further including:
a structure in which a poly insulator poly capacitative element is connected in parallel.

15. The semiconductor device according to claim 3, further including:
a structure in which a comb-shaped wiring capacitative element is connected in parallel.

16. The semiconductor device according to claim 3, further including:
a structure in which a poly insulator poly capacitative element is connected in parallel.

17. The semiconductor device according to claim 4, further including:
a structure in which a comb-shaped wiring capacitative element is connected in parallel.

18. The semiconductor device according to claim 4, further including:
a structure in which a poly insulator poly capacitative element is connected in parallel.

19. The semiconductor device according to claim 5, further including:
a structure in which a comb-shaped wiring capacitative element is connected in parallel.

20. The semiconductor device according to claim 5, further including:
a structure in which a poly insulator poly capacitative element is connected in parallel.

* * * * *